(12) United States Patent
Miki

(10) Patent No.: US 10,852,972 B2
(45) Date of Patent: Dec. 1, 2020

(54) RETRIEVAL MEMORY AND RETRIEVAL SYSTEM

(71) Applicant: RENESAS ELECTRONICS CORPORATION, Tokyo (JP)

(72) Inventor: Takeo Miki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/178,325

(22) Filed: Nov. 1, 2018

(65) Prior Publication Data

US 2019/0196715 A1  Jun. 27, 2019

(30) Foreign Application Priority Data

Dec. 22, 2017 (JP) ................... 2017-246705

(51) Int. Cl.
| | |
|---|---|
| *G06F 3/06* | (2006.01) |
| *G11C 15/04* | (2006.01) |
| *G06F 16/903* | (2019.01) |
| *G11C 15/00* | (2006.01) |

(52) U.S. Cl.
CPC ............ *G06F 3/064* (2013.01); *G06F 3/0604* (2013.01); *G06F 3/0673* (2013.01); *G06F 16/90339* (2019.01); *G11C 15/00* (2013.01); *G11C 15/04* (2013.01)

(58) Field of Classification Search
CPC ........... G06F 12/1081; G06F 16/90339; G06F 12/00–16; G11C 15/00–046; H04L 45/7457
See application file for complete search history.

(56) References Cited

U.S. PATENT DOCUMENTS

| | | | |
|---|---|---|---|
| 6,763,425 B1 | 7/2004 | Pereira | |
| 6,934,795 B2 | 8/2005 | Nataraj et al. | |
| 7,246,198 B2 | 7/2007 | Nataraj et al. | |
| 2002/0075714 A1* | 6/2002 | Pereira | G11C 15/00 365/49.1 |
| 2002/0122337 A1 | 9/2002 | Kanazawa et al. | |
| 2008/0239778 A1* | 10/2008 | Shastry | G11C 15/04 365/49.17 |
| 2017/0147499 A1* | 5/2017 | Mohan | G06F 12/10 |

OTHER PUBLICATIONS

Extended European Search Report issued in corresponding European Patent Application No. 18206432.9-1203, dated May 23, 2019.

* cited by examiner

*Primary Examiner* — Nicholas J Simonetti
(74) *Attorney, Agent, or Firm* — McDermott Will & Emery LLP

(57) ABSTRACT

There is provided a retrieval memory that can easily manage address information. A retrieval memory which retrieves whether or not inputted retrieval data matches entry data stored in a memory cell array and outputs address information corresponding to matched entry data includes a plurality of retrieval blocks and an output control unit for outputting the address information. The address information includes a block address for specifying at least one of the retrieval blocks and a logical address corresponding to entry data in the specified retrieval block. The output control unit outputs address information that is reset so that the address information corresponding to the entry data becomes continuous in an address space based on a size of the entry data.

6 Claims, 16 Drawing Sheets

| ENTRY DATA WIDTH | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|
| DBW80 | | | | | | | | | | LA [11:0] | | | | | | | | | | | |
| DBW160 | | | | BA [8:0] | | | | | | 1'b0 | | LA [10:0] | | | | | | | | | |
| DBW320 | | | | | | | | | | 2'b0 | | LA [9:0] | | | | | | | | | |
| DBW640 | | | | | | | | | | 3'b0 | | LA [8:0] | | | | | | | | | |

| SRAM CELL (X CELL) | SRAM CELL (Y CELL) | TCAM CELL DATA |
|---|---|---|
| "1" | "0" | "0" |
| "0" | "1" | "1" |
| "0" | "0" | "*" (don't care) |
| "1" | "1" | NON-USE |

FIG. 6

| ENTRY DATA WIDTH | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|
| DBW80 | BA [8:0] | | | | | | | | | LA [11:0] | | | | | | | | | | | |
| DBW160 | BA [8:0] | | | | | | | | | 1'b0 | | LA [10:0] | | | | | | | | | |
| DBW320 | BA [8:0] | | | | | | | | | 2'b0 | | | LA [9:0] | | | | | | | | |
| DBW640 | BA [8:0] | | | | | | | | | 3'b0 | | | | LA [8:0] | | | | | | | |

FIG. 7A

| Blk# | DBW80 | DBW160 | DBW320 | DBW640 |
|---|---|---|---|---|
| 0 | 0-4095 | 0-2047 | 0-1023 | 0-511 |
| 1 | 4096-8191 | 4096-6143 | 4096-5119 | 4096-4607 |
| 2 | 8192-12287 | 8192-10239 | 8192-9215 | 8192-8703 |
| 3 | 12288-16383 | 12288-14335 | 12288-13311 | 12288-12799 |

FIG. 7B

| Address | DBW80 | DBW160 | DBW320 | DBW640 |
|---|---|---|---|---|
| 0 ⋮ 4095 | Blk#0 (4096-Entry) | #0(2048-Entry) | #0(1024-Entry) | #0(512-Entry) |
| 4096 ⋮ 8191 | Blk#1 (4096-Entry) | #1(2048-Entry) | #1(1024-Entry) | #1(512-Entry) |
| 8192 ⋮ 12287 | Blk#2 (4096-Entry) | #2(2048-Entry) | #2(1024-Entry) | #2(512-Entry) |
| 12288 ⋮ 16383 | Blk#3 (4096-Entry) | #3(2048-Entry) | #3(1024-Entry) | #3(1512Entry) |

FIG. 8

| DBW | BIT SHIFT AMOUNT |
|---|---|
| 80 | 0 |
| 160 | 1bit |
| 320 | 2bit |
| 640 | 3bit |

FIG. 9

| ENTRY DATA WIDTH | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|
| DBW80 | | | | | | | | | | Local Address [11:0] | | | | | | | | | | | |
| DBW160 | 1'b0 | Block Address [8:0] | | | | | | | | | Local Address [10:0] | | | | | | | | | | |
| DBW320 | 2'b0 | | | | | | | | | | | Local Address [9:0] | | | | | | | | | |
| DBW640 | 3'b0 | | | | | | | | | | | | Local Address [8:0] | | | | | | | | |

FIG. 10A

| Blk# | DBW80 | DBW160 | DBW320 | DBW640 |
|---|---|---|---|---|
| 0 | 0-4095 | 0-2047 | 0-1023 | 0-511 |
| 1 | 4096-8191 | 2048-4095 | 1024-2047 | 512-1023 |
| 2 | 8192-12287 | 4096-6143 | 2048-3071 | 1024-1535 |
| 3 | 12288-16383 | 6144-8191 | 3072-4095 | 1536-2047 |

FIG. 10B

| Address0 | DBW80 | DBW160 | DBW320 | DBW640 |
|---|---|---|---|---|
| 0 ⋮ 4095 | Blk#0 (4096-Entry) | #0(2048-Entry) | #0(1024-Entry) | #0(512-Entry) |
| | | | | #1(512-Entry) |
| | | | #1(1024-Entry) | #2(512-Entry) |
| | | | | #3(512-Entry) |
| | | #1(2048-Entry) | #2(1024-Entry) | |
| | | | #3(1024-Entry) | |
| 4096 ⋮ 8191 | Blk#1 (4096-Entry) | #2(2048-Entry) | | |
| | | #3(2048-Entry) | | |
| 8192 ⋮ 12287 | Blk#2 (4096-Entry) | | | |
| 12288 ⋮ 16383 | Blk#3 (4096-Entry) | | | |

| ENTRY DATA WIDTH | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|
| DBW80 | | | | | | | | | | LA [11:0] | | | | | | | | | | | |
| DBW160 | BA [8:0] | | | | | | | | | LA [11:1] | | | | | | | | | | | 1'b0 |
| DBW320 | | | | | | | | | | LA [11:2] | | | | | | | | | | 2'b0 | |
| DBW640 | | | | | | | | | | LA [11:3] | | | | | | | | | 3'b0 | | |

FIG. 14

| PHYSICAL ADDRESS | | LOGICAL ADDRESS | | |
|---|---|---|---|---|
| BLK# | ENTRY DATA | LOGICAL BLOCK ADDRESS | DBW | Hit-Index |
| 000 | 4096 | 000 | DBW80 | 00000-00FFF |
| 001 | 4096 | 001 | DBW80 | 01000-01FFF |
| 002 | 4096 | 002 | DBW80 | 02000-02FFF |
| 003 | 4096 | 003 | DBW80 | 03000-03FFF |
| 004 | 2048 | 000 | DBW160 | 00000-007FF |
| 005 | 2048 | 001 | DBW160 | 00800-00FFF |
| 006 | 1024 | 000 | DBW320 | 00000-003FF |
| 007 | 1024 | 001 | DBW320 | 00400-007FF |
| 008 | 1024 | 002 | DBW320 | 00800-00BFF |
| 009 | 1024 | 003 | DBW320 | 00C00-00FFF |
| 00A | 512 | 000 | DBW640 | 00000-001FF |
| 00B | 512 | 001 | DBW640 | 00200-003FF |
| ... | | | | — |
| 100 | 2048 | 002 | DBW160 | 01000-017FF |
| 101 | 2048 | 003 | DBW160 | 01800-01FFF |
| 102 | 512 | 002 | DBW640 | 00400-005FF |
| 103 | 512 | 003 | DBW640 | 00600-007FF |
| 104 | 512 | 004 | DBW640 | 00800-009FF |
| 105 | 1024 | 004 | DBW320 | 01000-013FF |
| ... | | | | — |
| 1FE | | | | — |
| 1FF | | | | — |

FIG. 15

LOGICAL BLOCK ADDRESS ↓

| DW80 | DW160 | DW320 | DW640 |
|---|---|---|---|
| 000 | 000 | 000 | 000 |
| 001 | 001 | 001 | 001 |
| 002 | 002 | 002 | 002 |
| 003 | 003 | 003 | 003 |
| | | 004 | 004 |

RETRIEVAL MEMORY AND RETRIEVAL SYSTEM

CROSS-REFERENCE TO RELATED APPLICATIONS

The disclosure of Japanese Patent Application No. 2017-246705 filed on Dec. 22, 2017 including the specification, drawings and abstract is incorporated herein by reference in its entirety.

BACKGROUND

The present disclosure relates to a semiconductor device, and more particularly, to a retrieval memory.

A storage device called a retrieval memory or a CAM (Content Addressable Memory) retrieves a data word matching a retrieval word from among stored data words, and outputs the address of the matched data word if it is found.

The CAM includes a BCAM (Binary CAM) and a TCAM (Ternary CAM). Each memory cell of the BCAM stores information of either "0" or "1". On the other hand, in the TCAM, each memory cell can store the information of "Don't Care" (a symbol "*" is used in this example) in addition to "0" and "1". In this context, "*" may be either "0" or "1".

The TCAM device is widely used for address retrieval and access control in a router for a network such as the Internet. To deal with larger capacity, the TCAM device generally has multiple arrays and simultaneously performs a search operation on each array.

The TCAM device can compare input search data (input packet) and TCAM cell data at the same time, and is therefore faster than using a RAM (Random Access Memory) in all retrieval uses.

More specifically, the TCAM device has a match line (ML) for indicating a match/mismatch between information stored in a memory cell and data that a user wants to retrieve by comparing both the data.

Further, address information (Hit Index) corresponding to a matched match line is outputted.

Further, recently, the TCAM device capable of adjusting (switching) the size of an entry data width has appeared, and methods for providing a table for conversion, for each data block size, of address information (Hit Index) in accordance with the switching are disclosed (U.S. Pat. Nos. 6,934,795, 7,246,198).

SUMMARY

On the other hand, the address information (Hit Index) outputted from the TCAM device might be discontinuous in accordance with the adjustment of the size of the entry data width.

This causes a blank in an address space, and there is room for improvement in terms of management. The present disclosure has been made to solve the above problem, and provides a retrieval memory that can easily manage address information.

The other problems and novel features will become apparent from the description of this specification and the accompanying drawings.

A retrieval memory which retrieves whether or not inputted retrieval data matches entry data stored in a memory cell array and outputs address information corresponding to matched entry data, according to an aspect, includes a plurality of retrieval blocks and an output control unit for outputting the address information. The address information includes a block address for specifying at least one of the retrieval blocks and a logical address corresponding to entry data in the specified retrieval block. The output control unit outputs address information that is reset so that the address information corresponding to the entry data becomes continuous in an address space based on a size of the entry data.

According to one embodiment, the retrieval memory of the present disclosure can easily manage the address information.

BRIEF DESCRIPTION OF THE DRAWINGS

FIG. 6 is a diagram for explaining address information of multiple segments 12 as a comparison example.

FIGS. 7A and 7B are diagrams for explaining the address space of four segments 12 as a comparison example.

FIG. 8 is a diagram for explaining the bit shift amount of a conversion circuit 17 according to the first embodiment.

FIG. 9 is a diagram for explaining address information according to the first embodiment.

FIGS. 10A and 10B are diagrams for explaining the address space of the multiple segments 12 according to the first embodiment.

FIG. 14 is a diagram for explaining the configuration of a management table for managing a retrieval memory 8 according to the second embodiment.

FIG. 15 is a diagram for explaining the setting of logical block addresses according to the second embodiment.

DETAILED DESCRIPTION

Figure 1:
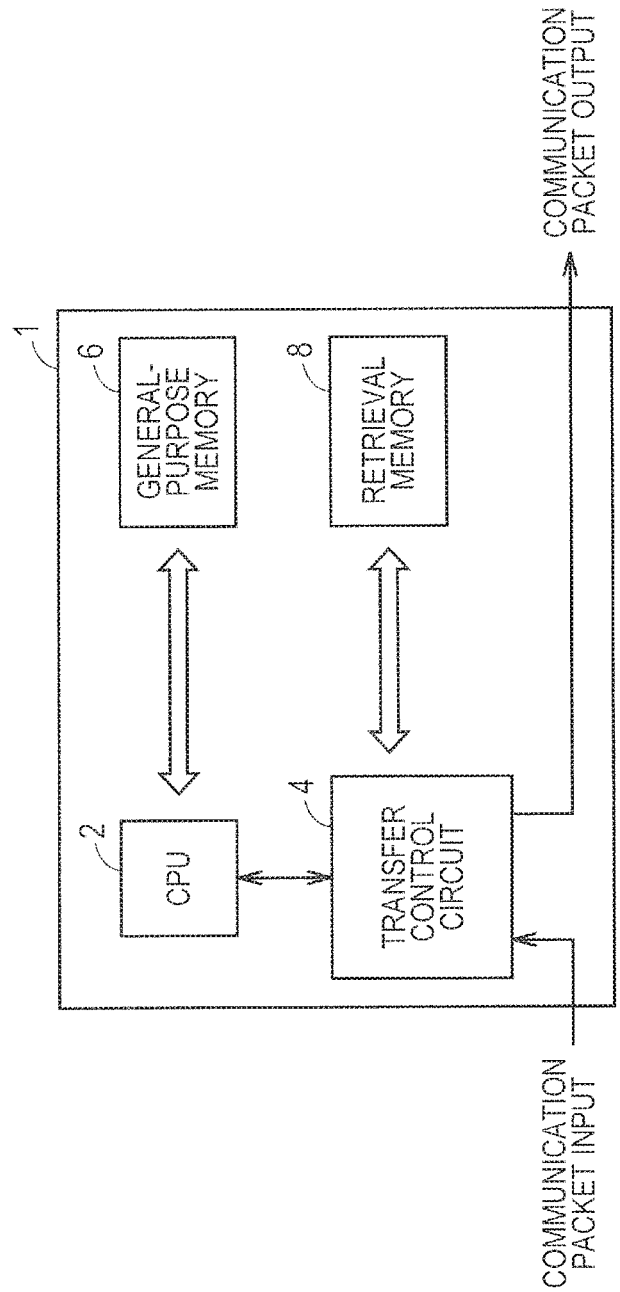
FIG. 1 is a diagram for explaining the configuration of a communication device 1 according to a first embodiment.

Hereinafter, embodiments will be described in detail with reference to the drawings. In the drawings, the same or equivalent parts are denoted by the same reference numerals, and their description will not be repeated.

First Embodiment

<Overall Configuration of Communication Device 1>

FIG. 1 is a diagram for explaining the configuration of a communication device 1 according to a first embodiment.

As shown in FIG. 1, the communication device 1 is a communication device such as a switch or a router. The communication device 1 includes a CPU (Central Processing Unit) 2, a transfer control circuit 4, a general-purpose memory 6, and a retrieval memory 8.

The CPU 2 controls the whole device. The CPU 2 achieves various functions in cooperation with a program stored in the general-purpose memory 6. For example, the general-purpose memory 6 can be configured with a DRAM (Dynamic Random Access Memory), and constructs an operating system (OS) in cooperation with the CPU 2. The CPU 2 exchanges information with an adjacent communication device or the like, and maintains and manages information required for transfer processing.

The transfer control circuit 4 executes the transfer processing of a communication packet. The transfer control circuit 4 is provided with dedicated hardware such as an ASIC (Application Specific Integrated Circuit) specialized for the transfer processing or an NPU (Network Processing Unit). The transfer control circuit 4 accesses the retrieval memory 8, and acquires information required for the transfer processing.

The retrieval memory 8 using a TCAM device in this example will be described.

[Configuration of TCAM Cell]

Figures 2, 3:
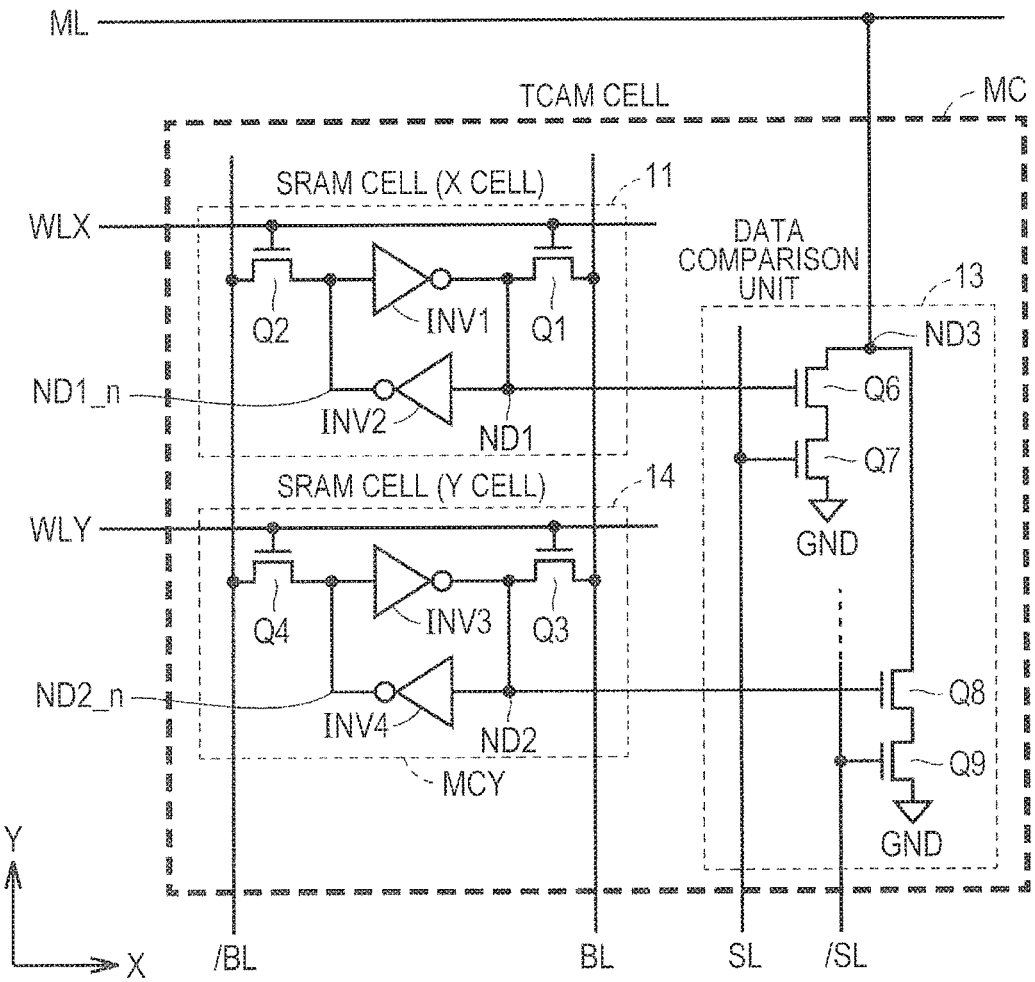
FIG. 2 is a circuit diagram showing an example of the configuration of a TCAM cell.
FIG. 3 is a table showing the correspondence relationship between the storage contents of an X cell and a Y cell in FIG. 2 and TCAM data.

FIG. 2 is a circuit diagram showing an example of the configuration of a TCAM cell.

Referring to FIG. 2, the TCAM cell (also referred to as a memory cell MC) includes two SRAM cells (Static Random Access Memory Cells) 11, 14 and a data comparison unit 13. The SRAM cell 11 is also referred to as an X cell, and the SRAM cell 14 is also referred to as a Y cell. The X cell 11 stores 1 bit of data having a mutually complementary relationship (if one of the data is "1", the other is "0") in an internal storage node pair ND1, ND1_n. The Y cell 14 stores 1 bit of data having a mutually complementary relationship in an internal storage node pair ND2, ND2_n. The TCAM cell is also referred to as a retrieval memory cell.

The TCAM cell is coupled to a bit line pair BL, /BL, a search line pair SL, /SL, a match line ML, and word lines WLX, WLY. The bit line pair BL, /BL extends in the column direction (Y direction) of a TCAM cell array 20 in FIG. 4, and is shared among multiple TCAM cells arranged in the column direction. The search line pair SL, /SL extends in the column direction (Y direction) of the TCAM cell array 20, and is shared among the multiple TCAM cells arranged in the column direction.

The match line ML extends in the row direction (X direction) of the TCAM cell array 20, and is shared among multiple TCAM cells arranged in the row direction. The word lines WLX, WLY extend in the row direction (X direction) of the TCAM cell array 20, and are shared among the multiple TCAM cells arranged in the row direction.

The X cell 11 includes inverters INV1, INV2 and N-channel MOS (Metal Oxide Semiconductor) transistors Q1, Q2.

The inverter INV1 is coupled between the storage node ND1 and the storage node ND1_n so that a direction from the storage node ND1_n toward the storage node ND1 is a forward direction. The inverter INV2 is coupled in parallel with and in a direction opposite to the inverter INV1. The MOS transistor Q1 is coupled between the storage node ND1 and the bit line BL. The MOS transistor Q2 is coupled between the storage node ND1_n and the bit line /BL. The gates of the MOS transistors Q1, Q2 are coupled to the word line WLX.

The Y cell 14 includes inverters INV3, INV4 and MOS (Metal Oxide Semiconductor) transistors Q3, Q4. The inverter INV3 is coupled between the storage node ND2 and the storage node ND2_n so that a direction from the storage node ND2_n toward the storage node ND2 is a forward direction. The inverter INV4 is coupled in parallel with and in a direction opposite to the inverter INV3. The MOS transistor Q3 is coupled between the storage node ND2 and the bit line BL. The MOS transistor Q4 is coupled between the storage node ND2_n and the bit line /BL. The gates of the MOS transistors Q3, Q4 are coupled to the word line WLY.

The data comparison unit 13 includes N-channel MOS transistors Q6 to Q9. The MOS transistors Q6, Q7 are coupled in series between a node ND3 which is a coupling point with the match line ML and a ground node GND. The MOS transistors Q8, Q9 are coupled in series between the node ND3 and the ground node GND, and coupled in parallel with the whole of the MOS transistors Q6, Q7 coupled in series. The gates of the MOS transistors Q6, Q8 are coupled to the storage nodes ND1, ND2, respectively. The gates of the MOS transistors Q7, Q9 are coupled to the search lines SL, /SL, respectively.

FIG. 3 is a table showing the correspondence relationship between the storage contents of the X cell and the Y cell in FIG. 2 and TCAM data.

Referring to FIGS. 2 and 3, the TCAM cell can store three values of "0", "1", and "*" (don't care), using 2-bit SRAM cells. More specifically, if "1" is stored in the storage node ND1 of the X cell 11 and "0" is stored in the storage node ND2 of the Y cell 14, "0" is assumed to be stored in the TCAM cell. If "0" is stored in the storage node ND1 of the X cell 11 and "1" is stored in the storage node ND2 of the Y cell 14, "1" is assumed to be stored in the TCAM cell. If "0" is stored in the storage node ND1 of the X cell 11 and "0" is stored in the storage node ND2 of the Y cell 14, "*" (don't care) is assumed to be stored in the TCAM cell. The case where "1" is stored in the storage node ND1 of the X cell 11 and "1" is stored in the storage node ND2 of the Y cell 14 is not used.

According to the configuration of the TCAM cell, if search data is "1" (i.e., the search line SL is "1", and the search line /SL is "0"), and TCAM data is "0" (i.e., the storage node ND1 is "1", and the storage node ND2 is "0"), the MOS transistors Q6, Q7 are turned on, so that the potential of the precharged match line ML is drawn to a ground potential. If the search data is "0" (i.e., the search line SL is "0", and the search line /SL is "1"), and the TCAM data is "1" (i.e., the storage node ND1 is "0", and the storage node ND2 is "1"), the MOS transistors Q8, Q9 are turned on, so that the potential of the precharged match line ML is drawn to the ground potential. That is, if the search data and the TCAM data do not match, the potential of the match line ML is drawn to the ground potential.

On the other hand, if the inputted search data is "1" and the TCAM data is "1" or "*", or if the search data is "0" and the TCAM data is "0" or "*" (i.e., if both the data match), the potential (power supply voltage VDD level) of the precharged match line ML is maintained.

As described above, in the TCAM, unless data of all TCAM cells coupled to the match line ML corresponding to one entry (row) match the input search data, electric charge stored in the match line ML is drawn. Therefore, although retrieval in the TCAM is performed at high speed, there is a problem that large current is consumed.

Figure 4:
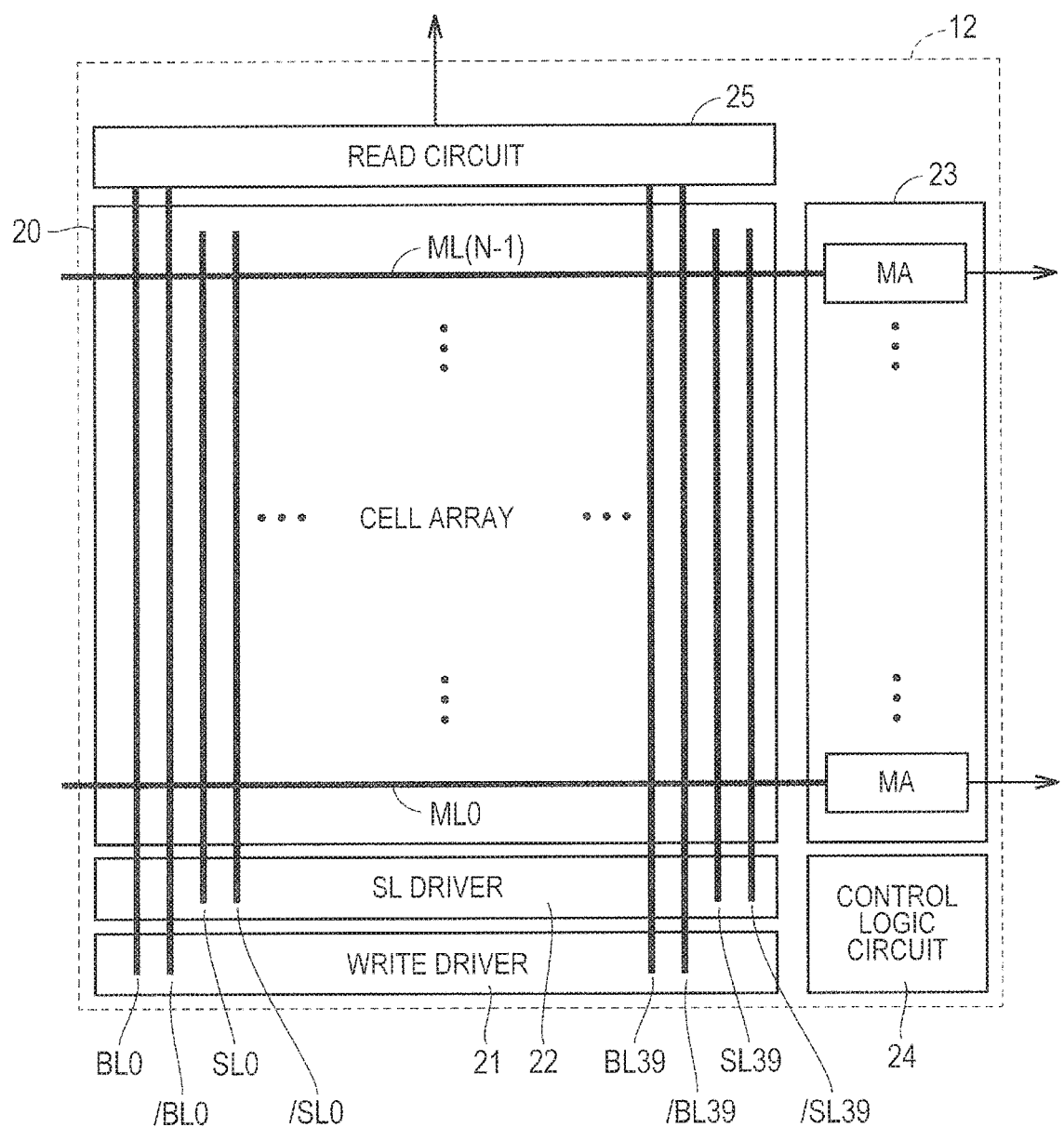
FIG. 4 is a diagram for explaining the configuration of a segment (sub-block) 12 included in a retrieval memory 8 according to the first embodiment.

FIG. 4 is a diagram for explaining the configuration of a segment (sub-block) 12 included in the retrieval memory 8 according to the first embodiment.

As shown in FIG. 4, the segment 12 includes a TCAM cell array 20 (also referred to simply as a cell array), a write driver 21, a search line driver 22, a match amplifier unit 23, a control logic circuit 24, and a read circuit 25.

Although not shown in the figure, the segment 12 includes a word line driver (not shown) for driving the word lines WLX, WLY, and an input/output circuit (not shown) for receiving input such as a control signal and an address signal.

The TCAM cell array 20 includes TCAM cells arranged in a matrix (m rows, k columns). In this example, in the cell array 20, the number of rows (the number of entries) m is N, and the number of columns (the number of bits) k is 40. Further, the cell array 20 has at least one redundant memory cell column.

Corresponding to the respective columns of the cell array 20, k (k=40) bit line pairs (from BL0 and/BL0 to BL(k−1) and/BL(k−1)) and k (k=40) search line pairs (from SL0 and /SL0 to SL(k−1) and/SL(k−1)) are provided.

Corresponding to the respective rows of the cell array 20, m (m=N) match lines (from ML0 to ML(N−1)), m word lines for X cells (from WLX0 to WLX(N−1)) (not shown), and m word lines for Y cells (from WLY0 to WLY(N−1)) (not shown) are provided.

The write driver 21 supplies write data to each TCAM cell through the bit line pair BL, /BL at the time of writing. The search line driver 22 supplies search data to each TCAM cell through the search line pair SL, /SL at the time of retrieval.

The control logic circuit 24 controls the operation of the whole of the segment 12. For example, at the time of retrieval, the control logic circuit 24 receives a search command, outputs a control signal to the search line driver 22 and the match amplifier unit 23, and thereby controls the operations of the search line driver 22, the match amplifier unit 23, and a precharge circuit. At the time of reading, the control logic circuit 24 receives a read command, and outputs a control signal for controlling the read circuit 25. Thereby, it is possible to read and output entry data stored in the cell array 20.

The match amplifier unit 23 includes multiple match amplifiers MA corresponding to the respective rows of the cell array. The match amplifier MA detects whether or not the corresponding TCAM cell data and the corresponding part of input search data match based on the potential of the corresponding match line ML at the time of retrieval. The match amplifier MA includes the precharge circuit for precharging the corresponding match line ML at the time of retrieval.

Figure 5:
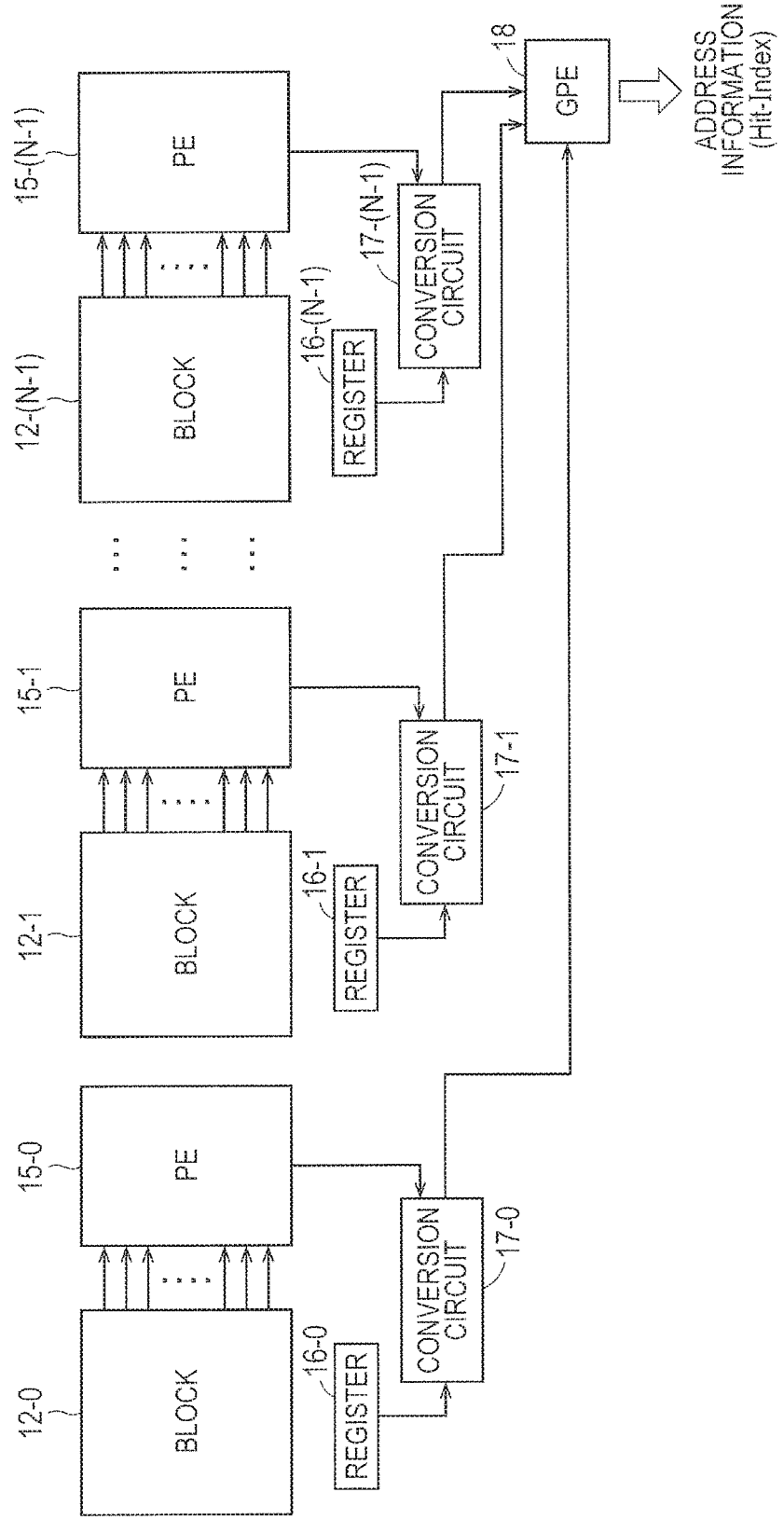
FIG. 5 is a diagram for explaining the configuration of multiple segments (sub-blocks) 12 included in the retrieval memory 8 according to the first embodiment.

FIG. 5 is a diagram for explaining the configuration of multiple segments (sub-blocks) 12 included in the retrieval memory 8 according to the first embodiment.

Referring to FIG. 5, there are provided multiple segments 12-0 to 12-(N−1), multiple priority encoders (PE) 15-0 to 15-(N−1), multiple registers 16-0 to 16-(N−1), multiple conversion circuits 17-0 to 17-(N−1), and a global priority encoder (GPE) 18.

The configuration of each of the segments 12-0 to 12-(N−1) is the same as the configuration of the segment 12 described with FIG. 4. The segments 12-0 to 12-(N−1) are also generically called the segment 12.

In the first embodiment, each segment 12 is provided so as to be able to adjust the size of the entry data. The multiple registers 16-0 to 16-(N−1) are also generically called the register 16. Further, the multiple conversion circuits 17-0 to 17-(N−1) are also generically called the conversion circuit 17.

More specifically, each segment 12 is provided so as to be able to adjust the size (DBW) of the entry data to 80 bits, 160 bits, 320 bits, and 640 bits, for example.

For example, assume that a bit width in one row of the segment 12 is 80 bits. In the case of 160 bits, two rows are used to be able to store one entry data. In the case of 320 bits, four rows are used to be able to store one entry data. In the case of 640 bits, eight rows are used to be able to store one entry data.

Accordingly, the number of allocated addresses is changed. For example, in the case of 160 bits, since two rows are used to store one entry data, the number of addresses is ½ of that in the case of 80 bits. In the case of 320 bits, since four rows are used to store one entry data, the number of addresses is ¼ of that in the case of 80 bits. In the case of 640 bits, since eight rows are used to store one entry data, the number of addresses is ⅛ of that in the case of 80 bits.

Each priority encoder 15 converts input from the match amplifier MA into address data, and generates final output. More specifically, the address data of high priority is outputted.

Each register 16 stores the block address of the corresponding segment, and also stores size information about the size of the entry data of the corresponding segment.

The above information is set by a user of the retrieval memory 8. Each conversion circuit 17 resets address information (Hit Index), based on the address data outputted from the priority encoder 15 and the block address and the size information inputted from the register 16.

The global priority encoder 18 receives the output of the multiple conversion circuits 17-0 to 17-(N−1), and finally outputs the address information of high priority.

FIG. 6 is a diagram for explaining address information of multiple segments 12 as a comparison example.

Referring to FIG. 6, an example in which a 21-bit address space is set in this example will be described.

The upper 9 bits of the 21-bit address space are allocated as a block address BA. The lower 12 bits are allocated as a local address LA. The block address BA is based on the block address set in the register 16, and the local address LA is the address data outputted from the priority encoder 15.

For example, in the case where the size of the entry data is set to 80 bits (DBW80), local addresses LA[11:0] are assigned to 4096 pieces of entry data stored in the segment 12, respectively.

Further, block addresses BA[8:0] are assigned to 512 segments 12-0 to 12-511, respectively.

In the case where the size of the entry data is set to 160 bits (DBW160), local addresses LA[10:0] are assigned to 2048 pieces of entry data stored in the segment 12, respectively. In this case, the priority encoder 15 outputs address data composed of 12 bits obtained by adding the 12th bit as a fixed value to the local address LA[10:0].

In the case where the size of the entry data is set to 320 bits (DBW320), local addresses LA[9:0] are assigned to 1024 pieces of entry data stored in the segment 12, respectively. In this case, the priority encoder 15 outputs address data composed of 12 bits obtained by adding the 11th bit and the 12th bit as a fixed value to the local address LA[9:0].

In the case where the size of the entry data is set to 640 bits (DBW640), local addresses LA[8:0] are assigned to 512 pieces of entry data stored in the segment 12, respectively. In this case as well, the priority encoder 15 outputs address data composed of 12 bits obtained by adding the 10th to 12th bits as a fixed value to the local address LA[8:0].

As described above, in the comparison example shown in FIG. 6, the priority encoder 15 outputs the address data obtained by bit-shifting the local address, based on the size information set in the register 16.

FIGS. 7A and 7B are diagrams for explaining the address space of four segments 12 as a comparison example.

FIG. 7A is a diagram for explaining the relationship between the size of the entry data and the address information (Hit Index).

An example in which block numbers Blk #0 to Blk #3 are provided for the four segments 12 will be described.

In this case, assume that the block address BA[8:0] of the block number Blk #0 is "0" in decimal notation. Assume that the block address BA[8:0] of the block number Blk #1 is "1" in decimal notation. Assume that the block address BA[8:0] of the block number Blk #2 is "2" in decimal notation. Assume that the block address BA[8:0] of the block number Blk #3 is "3" in decimal notation.

In the case where the size of the entry data is set to 80 bits (DBW80), as for the address information (Hit Index), "0 to 4095" in decimal notation by the local addresses LA[11:0] are assigned to 4096 pieces of entry data corresponding to the block (Blk #0), respectively.

Further, as for the address information (Hit Index), "4096 to 8191" in decimal notation are assigned to 4096 pieces of entry data corresponding to the block (Blk #1), respectively.

Further, as for the address information (Hit Index), "8192 to 12287" in decimal notation are assigned to 4096 pieces of entry data corresponding to the block (Blk #2), respectively.

Further, as for the address information (Hit Index), "12288 to 16383" in decimal notation are assigned to 4096 pieces of entry data corresponding to the block (Blk #3), respectively.

In the case where the size of the entry data is set to 160 bits (DBW160), as for the address information (Hit Index), "0 to 2047" in decimal notation by the local addresses LA[10:0] are assigned to 2048 pieces of entry data corresponding to the block (Blk #0), respectively.

Further, as for the address information (Hit Index), "4096 to 6143" in decimal notation are assigned to 2048 pieces of entry data corresponding to the block (Blk #1), respectively.

Further, as for the address information (Hit Index), "8192 to 10239" in decimal notation are assigned to 2048 pieces of entry data corresponding to the block (Blk #2), respectively.

Further, as for the address information (Hit Index), "12288 to 14335" in decimal notation are assigned to 2048 pieces of entry data corresponding to the block (Blk #3), respectively.

In the case where the size of the entry data is set to 320 bits (DBW320), as for the address information (Hit Index), "0 to 1023" in decimal notation by the local addresses LA[9:0] are assigned to 1024 pieces of entry data corresponding to the block (Blk #0), respectively.

Further, as for the address information (Hit Index), "4096 to 5119" in decimal notation are assigned to 1024 pieces of entry data corresponding to the block (Blk #1), respectively.

Further, as for the address information (Hit Index), "8192 to 9215" in decimal notation are assigned to 1024 pieces of entry data corresponding to the block (Blk #2), respectively.

Further, as for the address information (Hit Index), "12288 to 13311" in decimal notation are assigned to 1024 pieces of entry data corresponding to the block (Blk #3), respectively.

In the case where the size of the entry data is set to 640 bits (DBW640), as for the address information (Hit Index), "0 to 511" in decimal notation by the local addresses LA[8:0] are assigned to 512 pieces of entry data corresponding to the block (Blk #0), respectively.

Further, as for the address information (Hit Index), "4096 to 4607" in decimal notation are assigned to 512 pieces of entry data corresponding to the block (Blk #1), respectively.

Further, as for the address information (Hit Index), "8192 to 8703" in decimal notation are assigned to 512 pieces of entry data corresponding to the block (Blk #2), respectively.

Further, as for the address information (Hit Index), "12288 to 12799" in decimal notation are assigned to 512 pieces of entry data corresponding to the block (Blk #3), respectively.

FIG. 7B is a diagram for explaining the relationship between the address information (Hit Index) and the entry data width as a comparison example.

As shown in FIG. 7B, in the case where the size of the entry data is set to 80 bits (DBW80), the address space of the address information (Hit Index) composed of the block address and the local address is continuous between the blocks.

On the other hand, in the case where the size of the entry data is set to 160 bits (DBW160), 320 bits (DBW320), or 640 bits (DBW640), the address space is discontinuous between the blocks, and a gap (empty area) exists. Accordingly, complicated address management is required.

A method for eliminating the empty area between the blocks according to the first embodiment will be described.

More specifically, as shown in FIG. 6, in the case where the size of the entry data is set to 160 bits (DBW160), the local addresses LA[10:0] of the lower 12 bits are used as the address data, but the local address LA[11] as the 12th bit is not used and is a fixed value, which causes a 1-bit blank area.

In the case where the size of the entry data is set to 320 bits (DBW320), the local addresses LA[9:0] of the lower 12 bits are used as the address data, but the local addresses LA[11], LA[10] as the 11th and 12th bits are not used and are a fixed value, which causes a 2-bit blank area.

In the case where the size of the entry data is set to 640 bits (DBW640), the local addresses LA[8:0] of the lower 12 bits are used as the address data, but the local addresses LA[11], LA[10], LA[9] as the 10th, 11th, and 12th bits are not used and are a fixed value, which causes a 3-bit blank area.

Accordingly, in the method according to the first embodiment, the conversion circuit 17 performs the bit shift in accordance with the size of the entry data.

FIG. 8 is a diagram for explaining the bit shift amount of the conversion circuit 17 according to the first embodiment.

Referring to FIG. 8, in the case where the size of the entry data is set to 80 bits (DBW80), the conversion circuit 17 does not perform the bit shift.

In the case where the size of the entry data is set to 160 bits (DBW160), the conversion circuit 17 performs a 1-bit shift.

In the case where the size of the entry data is set to 320 bits (DBW320), the conversion circuit 17 performs a 2-bit shift.

In the case where the size of the entry data is set to 640 bits (DBW640), the conversion circuit 17 performs a 3-bit shift.

As described above, the conversion circuit 17 performs the bit shift equivalent to the blank area caused in accordance with the size of the entry data.

FIG. 9 is a diagram for explaining address information according to the first embodiment. Referring to FIG. 9, the conversion circuit 17 resets the address information (Hit Index) obtained by combining the block address BA inputted from the register 16 in accordance with the size information and the local address LA outputted from the priority encoder 15. In this case, in the case where the size of the entry data is set to 80 bits (DBW80), the conversion circuit 17 outputs the address information (Hit Index) obtained by combining the block address BA and the local address LA as they are without the bit shift.

In the case where the size of the entry data is set to 160 bits (DBW160), the conversion circuit 17 outputs the address information (Hit Index) obtained by combining the block address BA subjected to the 1-bit shift and the local address LA[10:0] of the 12-bit address data outputted from the priority encoder 15.

In the case where the size of the entry data is set to 320 bits (DBW320), the conversion circuit 17 outputs the address information (Hit Index) obtained by combining the block address BA subjected to the 2-bit shift and the local address LA[9:0] of the 12-bit address data outputted from the priority encoder 15.

In the case where the size of the entry data is set to 640 bits (DBW640), the conversion circuit 17 outputs the address information (Hit Index) obtained by combining the block address BA subjected to the 3-bit shift and the local address LA[8:0] of the 12-bit address data outputted from the priority encoder 15.

That is, by bit-shifting the block address BA in accordance with the size of the entry data, it is possible to treat the address information (Hit Index) composed of the block address BA and the local address LA as a continuous address space.

FIGS. 10A and 10B are diagrams for explaining the address space of the multiple segments 12 according to the first embodiment.

FIG. 10A is a diagram for explaining the relationship between the size of the entry data and the address information (Hit Index).

An example in which block numbers Blk #0 to Blk #3 are provided for four segments 12 will be described.

In this case, assume that the block address BA[8:0] of the block number Blk #0 is "0" in decimal notation. Assume that the block address BA[8:0] of the block number Blk #1 is "1" in decimal notation. Assume that the block address BA[8:0] of the block number Blk #2 is "2" in decimal notation. Assume that the block address BA[8:0] of the block number Blk #3 is "3" in decimal notation.

In the case where the size of the entry data is set to 80 bits (DBW80), as for the address information (Hit Index), "0 to 4095" in decimal notation are assigned to 4096 pieces of entry data corresponding to the block (Blk #0), respectively.

Further, as for the address information (Hit Index), "4096 to 8191" in decimal notation are assigned to 4096 pieces of entry data corresponding to the block (Blk #1), respectively.

Further, as for the address information (Hit Index), "8192 to 12287" in decimal notation are assigned to 4096 pieces of entry data corresponding to the block (Blk #2), respectively.

Further, as for the address information (Hit Index), "12288 to 16383" in decimal notation are assigned to 4096 pieces of entry data corresponding to the block (Blk #3), respectively.

In the case where the size of the entry data is set to 160 bits (DBW160), as for the address information (Hit Index), "0 to 2047" in decimal notation are assigned to 2048 pieces of entry data corresponding to the block (Blk #0), respectively.

Further, as for the address information (Hit Index), "2048 to 4095" in decimal notation are assigned to 2048 pieces of entry data corresponding to the block (Blk #1), respectively.

Further, as for the address information (Hit Index), "4096 to 6143" in decimal notation are assigned to 2048 pieces of entry data corresponding to the block (Blk #2), respectively.

Further, as for the address information (Hit Index), "6144 to 8191" in decimal notation are assigned to 2048 pieces of entry data corresponding to the block (Blk #3), respectively.

In the case where the size of the entry data is set to 320 bits (DBW320), as for the address information (Hit Index), "0 to 1023" in decimal notation are assigned to 1024 pieces of entry data corresponding to the block (Blk #0), respectively.

Further, as for the address information (Hit Index), "1024 to 2047" in decimal notation are assigned to 1024 pieces of entry data corresponding to the block (Blk #1), respectively.

Further, as for the address information (Hit Index), "2048 to 3071" in decimal notation are assigned to 1024 pieces of entry data corresponding to the block (Blk #2), respectively.

Further, as for the address information (Hit Index), "3072 to 4095" in decimal notation are assigned to 1024 pieces of entry data corresponding to the block (Blk #3), respectively.

In the case where the size of the entry data is set to 640 bits (DBW640), as for the address information (Hit Index), "0 to 511" in decimal notation are assigned to 512 pieces of entry data corresponding to the block (Blk #0), respectively.

Further, as for the address information (Hit Index), "512 to 1023" in decimal notation are assigned to 512 pieces of entry data corresponding to the block (Blk #1), respectively.

Further, as for the address information (Hit Index), "1024 to 1535" in decimal notation are assigned to 512 pieces of entry data corresponding to the block (Blk #2), respectively.

Further, as for the address information (Hit Index), "1536 to 2047" in decimal notation are assigned to 512 pieces of entry data corresponding to the block (Blk #3), respectively.

FIG. 10B is a diagram for explaining the relationship between the address information (Hit Index) according to the first embodiment and the entry data width.

As shown in FIG. 10B, in the case where the size of the entry data is set to 80 bits (DBW80), the address space is continuous between the blocks.

Also in the case where the size of the entry data is set to 160 bits (DBW160), 320 bits (DBW320), and 640 bits (DBW640), the gap (empty area) between the blocks is eliminated; therefore, the address space is continuous.

Thus, each conversion circuit 17 outputs the address information that is reset so that the address information corresponding to the entry data becomes continuous in the address space based on the size of the entry data.

Each conversion circuit 17 outputs the address information that is reset so that the address information corresponding to the entry data becomes continuous in the address space of (the maximum bit length–N bits) in the case where the size of the entry data is increased by $2^N$ times (N: natural number).

Each conversion circuit 17 executes shift arithmetic processing for shifting the block address by N bits in accordance with the size of the entry data.

Since the address information is continuous by the method according to the first embodiment, it is possible to reduce a load on a management side for managing the retrieval memory.

Figures 11, 12:
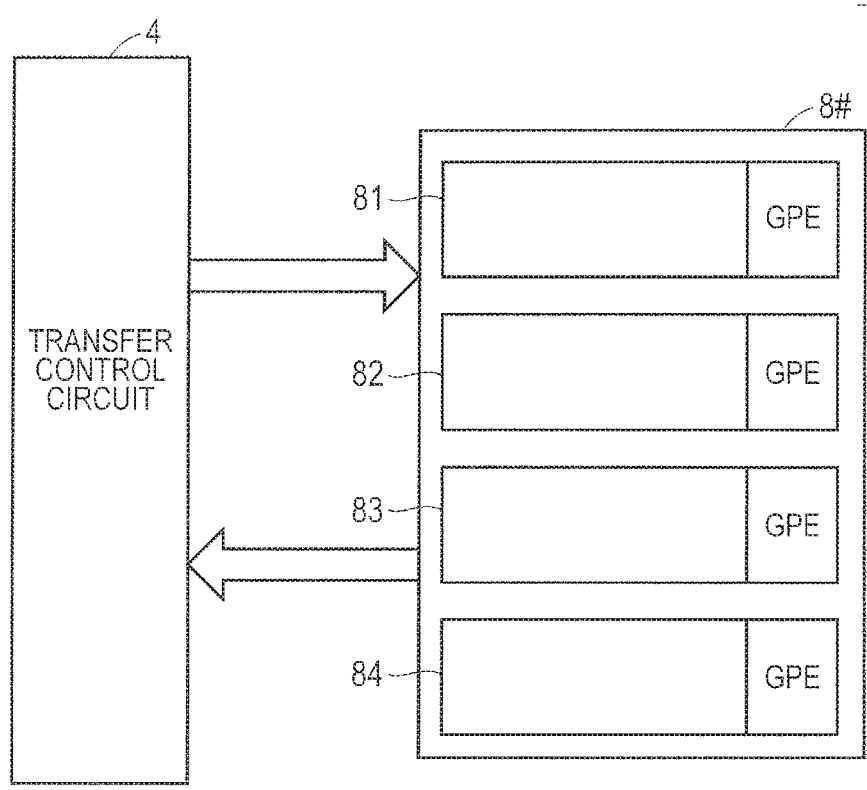
FIG. 11 is a diagram for explaining different address information of the multiple segments 12 as a comparison example.
FIG. 12 is a diagram for explaining a part of the configuration of a communication device 1# according to a second embodiment.

Next, a different output system of the priority encoder PE will be described. FIG. 11 is a diagram for explaining different address information of the multiple segments 12 as a comparison example.

Referring to FIG. 11, an example in which a 21-bit address space is set in this example will be described.

The upper 9 bits of the 21-bit address space are allocated as the block address BA. The lower 12 bits are allocated as the local address LA.

For example, in the case where the size of the entry data is set to 80 bits (DBW80), local addresses LA[11:0] are assigned to 4096 pieces of entry data stored in the segment 12 respectively, and outputted.

Further, block addresses BA[8:0] are assigned to 512 segments 12-0 to 12-511, respectively.

In the case where the size of the entry data is set to 160 bits (DBW160), local addresses LA[11:1] are assigned to 2048 pieces of entry data stored in the segment 12, respectively. The local addresses LA[11:0] in which the 0th bit, i.e., the local address LA[0] is a fixed value are outputted from the priority encoder 15.

In the case where the size of the entry data is set to 320 bits (DBW320), local addresses LA[11:2] are assigned to 1024 pieces of entry data stored in the segment 12, respectively. The local addresses LA[11:0] in which the 0th and 1st bits, i.e., the local addresses LA[0], LA[1] are a fixed value are outputted from the priority encoder 15.

In the case where the size of the entry data is set to 640 bits (DBW640), local addresses LA[11:3] are assigned to 512 pieces of entry data stored in the segment 12, respectively. The local addresses LA[11:0] in which the 0th, 1st, and 2nd bits, i.e., the local addresses LA[0], LA[1], LA[2] are a fixed value are outputted from the priority encoder 15.

In this configuration, in the case where the size of the entry data is set to 80 bits (DBW80), the address space is continuous between the blocks.

On the other hand, in the case where the size of the entry data is set to 160 bits (DBW160), 320 bits (DBW320), or 640 bits (DBW640), the address space is discontinuous between the blocks, and a gap (empty area) exists.

Accordingly, in this configuration as well, the conversion circuit 17 outputs the address information (Hit Index) obtained by combining the block address BA and the local address LA in accordance with the size of the entry data.

More specifically, in the case where the size of the entry data is set to 160 bits (DBW160), the conversion circuit 17 outputs the address information (Hit Index) obtained by 1-bit-shifting data obtained by combining the block address BA and the local address LA.

In the case where the size of the entry data is set to 320 bits (DBW320), the conversion circuit 17 outputs the address information (Hit Index) obtained by 2-bit-shifting data obtained by combining the block address BA and the local address LA.

In the case where the size of the entry data is set to 640 bits (DBW640), the conversion circuit 17 outputs the address information (Hit Index) obtained by 3-bit-shifting data obtained by combining the block address BA and the local address LA.

Thereby, the same address information as described with FIG. 9 is obtained. The gap (empty area) between the blocks is eliminated; therefore, the address space is continuous.

Since the address information is continuous by the method according to the first embodiment, it is possible to reduce the load on the management side for managing the retrieval memory.

Second Embodiment

FIG. 12 is a diagram for explaining a part of the configuration of a communication device 1# according to a second embodiment.

Referring to FIG. 12, the difference is that a retrieval memory 8# is provided in place of the retrieval memory 8. The retrieval memory 8# includes multiple retrieval units 81 to 84.

Each retrieval unit 81 to 84 includes multiple segments 12. The multiple retrieval units 81 to 84 may have entry data of different sizes respectively. For example, in the retrieval unit 81, the size (DBW) of the entry data is set to 80 bits. In the retrieval unit 82, the size (DBW) of the entry data is set to 160 bits. In the retrieval unit 83, the size (DBW) of the entry data is set to 320 bits. In the retrieval unit 84, the size (DBW) of the entry data is set to 640 bits.

Figure 13:
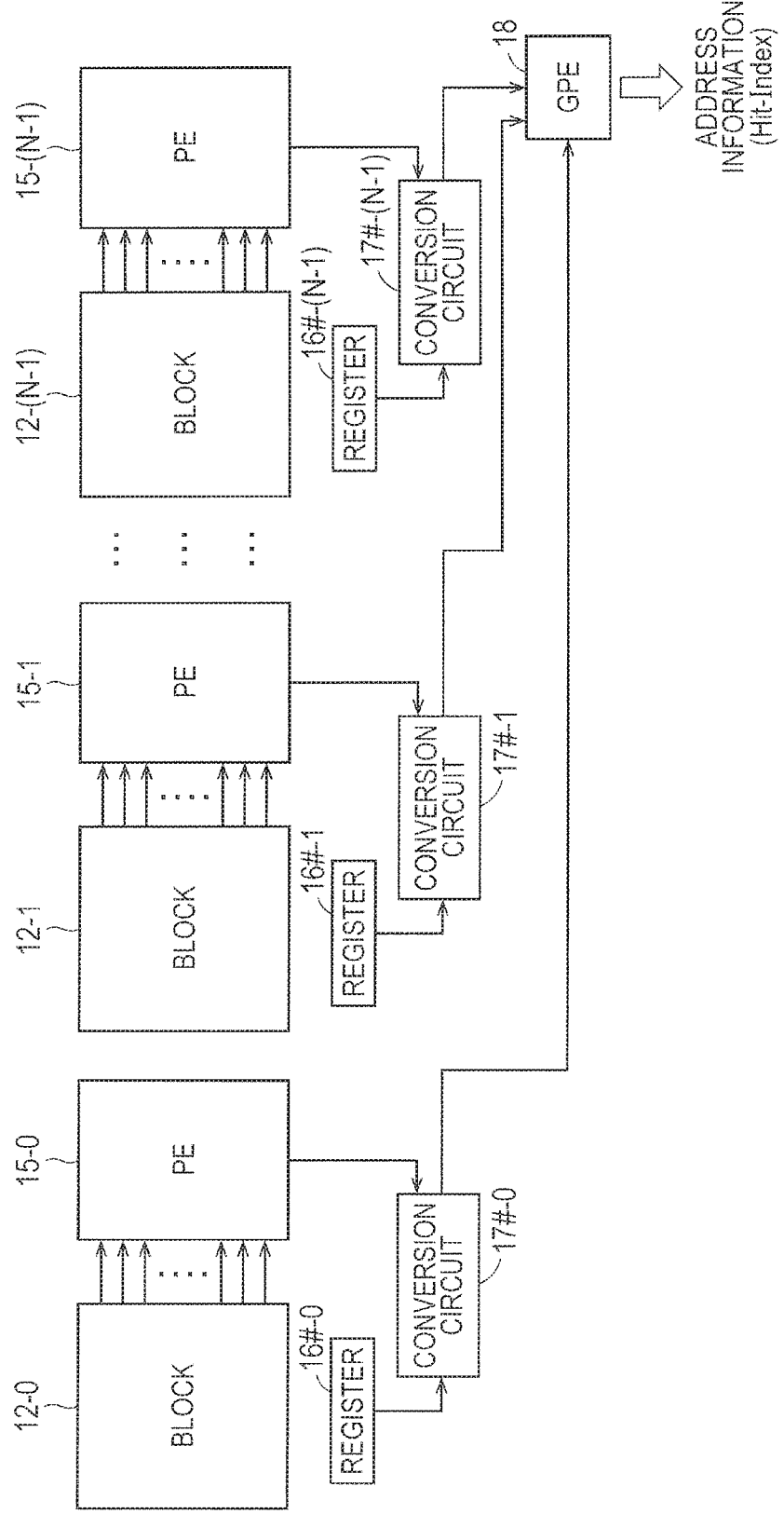
FIG. 13 is a diagram for explaining the configuration of multiple segments (sub-blocks) 12 included in each of retrieval units 81 to 84 according to the second embodiment.

FIG. 13 is a diagram for explaining the configuration of multiple segments (sub-blocks) 12 included in each of the retrieval units 81 to 84 according to the second embodiment.

Referring to FIG. 13, there are provided multiple segments 12-0 to 12-(N−1), multiple priority encoders (PE) 15-0 to 15-(N−1), multiple registers 16#-0 to 16#-(N−1), multiple conversion circuits 17#-0 to 17#-(N−1), and a global priority encoder (GPE) 18.

The configuration of each of the segments 12-0 to 12-(N−1) is the same as the configuration of the segment 12 described with FIG. 4.

In the second embodiment, each segment 12 is provided so as to be able to adjust the size of the entry data.

More specifically, each segment 12 is provided so as to be able to adjust the size (DBW) of the entry data to 80 bits, 160 bits, 320 bits, and 640 bits, for example.

Each priority encoder 15 converts input from the match amplifier MA into address data, and generates final output. More specifically, the address data of high priority is outputted.

Each register 16# stores the logical block address of the corresponding segment, and also stores size information about the size of the entry data of the corresponding segment.

Each conversion circuit 17# resets address information (Hit Index), based on the address data outputted from the priority encoder 15 and the logical block address and the size information inputted from the register 16#.

The global priority encoder 18 receives the output of the multiple conversion circuits 17#-0 to 17#-(N−1), and finally outputs the address information of high priority.

FIG. 14 is a diagram for explaining the configuration of a management table for managing the retrieval memory 8# according to the second embodiment.

Referring to FIG. 14, the management table is provided in an upper layer than the retrieval memory, for example, in a system memory, and specifies the relationship between the physical block address and the logical block address of each segment of the retrieval memory.

In this example, the block address set as the physical address is converted into the logical block address for each entry data size, and the addresses are managed.

At initial setting, the transfer control circuit 4 refers to the management table, and sets the logical block address in the register corresponding to the segment specified by the physical block address.

FIG. 15 is a diagram for explaining the setting of the logical block address according to the second embodiment.

As shown in FIG. 15, the logical block address is set in accordance with the size (DBW) of the entry data.

More specifically, the first logical block address of the first segment 12 in which the size (DBW) of the entry data is set to 80 bits is set to "000".

Subsequently, logical block addresses are sequentially set in ascending order for each size of the entry data.

Referring again to FIG. 14, the address information (Hit Index) is managed in accordance with the size of the entry data.

In this example, there is shown a case in which "000" in hexadecimal notation as the logical block address is assigned to the segment 12 of a block number Blk #000 as the physical address, and the size (DBW) of the entry data is set to 80 bits.

In this case, as for the address information (Hit Index), "00000 to O0FFF" in hexadecimal notation are assigned to 4096 pieces of entry data corresponding to the block number Blk #000 (logical block address "000"), respectively.

Next, there is shown a case in which "001" in hexadecimal notation as the logical block address is assigned to the segment 12 of a block number Blk #001 as the physical address, and the size (DBW) of the entry data is set to 80 bits.

In this case, as for the address information (Hit Index), "01000 to 01FFF" in hexadecimal notation are assigned to 4096 pieces of entry data corresponding to the block number Blk #001 (logical block address "001"), respectively.

Next, there is shown a case in which "002" in hexadecimal notation as the logical block address is assigned to the segment 12 of a block number Blk #002 as the physical address, and the size (DBW) of the entry data is set to 80 bits.

In this case, as for the address information (Hit Index), "02000 to 02FFF" in hexadecimal notation are assigned to 4096 pieces of entry data corresponding to the block number Blk #002 (logical block address "002"), respectively.

Next, there is shown a case in which "003" in hexadecimal notation as the logical block address is assigned to the segment 12 of a block number Blk #003 as the physical address, and the size (DBW) of the entry data is set to 80 bits.

In this case, as for the address information (Hit Index), "03000 to 03FFF" in hexadecimal notation are assigned to 4096 pieces of entry data corresponding to the block number Blk #003 (logical block address "003"), respectively. In this case, the register 16# provided corresponding to each segment 12 stores the value of the logical block address and the information about the size of the entry data, based on the management table at initial setting.

The conversion circuit 17# outputs the address information (Hit Index) based on the information stored in the register 16# and the local address LA outputted from the priority encoder 15. That is, the conversion circuit 17# converts the address data composed of the logical block address stored in the register 16# and the local address LA outputted from the priority encoder 15 into a continuous address space, using the same method as in the first embodiment.

The segment 12 included in the retrieval unit 81 in which the size (DBW) of the entry data is set to, e.g., 80 bits and the corresponding register 16# and conversion circuit 17# will be described.

For example, the logical block address "000" and the size information "DBW80" of the entry data are stored in the register 16#-0 described with FIG. 13.

The conversion circuit 17#-0 resets the address data composed of the logical block address "000" stored in the register 16#-0 and the local address outputted from the priority encoder 15-0, based on the size information "DBW80" of the entry data stored in the register 16#-0.

As a result, the conversion circuit 17#-0 outputs the address information obtained by conversion into one value among "00000 to O0FFF" assigned as the address information (Hit Index).

Similarly, the logical block addresses "001" to "003" and the size information "DBW80" of the entry data are stored in the registers 16#-1 to 16#-3, respectively.

The conversion circuits 17#-1 to 17#-3 reset the address data outputted from the priority encoders 15-1 to 15-3, based on the logical block addresses "001" to "003" and the size information "DBW80" of the entry data stored in the registers 16#-1 to 16#-3, respectively.

The conversion circuit 17#-1 outputs the address information obtained by converting the address data outputted from the priority encoder 15-1 into one value among "01000 to 01FFF" assigned as the address information (Hit Index).

The conversion circuit 17#-2 outputs the address information obtained by converting the address data outputted from the priority encoder 15-2 into one value among "02000 to 02FFF" assigned as the address information (Hit Index). The conversion circuit 17#-3 outputs the address information obtained by converting the address data outputted from the priority encoder 15-3 into one value among "03000 to 03FFF" assigned as the address information (Hit Index).

Thus, the logical block address is set in each register 16#, thereby enabling the address information (Hit Index) outputted from the retrieval unit 81 to be continuous in the address space based on the size of the entry data, regardless of the physical block address.

Similarly, the first logical block address of the first segment 12 in which the size (DBW) of the entry data is set to 160 bits is set to "000".

There is shown a case in which "000" in hexadecimal notation as the logical block address is assigned to the segment 12 of a block number Blk #004 as the physical address, and the size (DBW) of the entry data is set to 160 bits.

In this case, as for the address information (Hit Index), "00000 to 007FF" in hexadecimal notation are assigned to 2048 pieces of entry data corresponding to the block number Blk #004 (logical block address "000"), respectively. Next, there is shown a case in which "001" in hexadecimal notation as the logical block address is assigned to the segment 12 of a block number Blk #005 as the physical address, and the size (DBW) of the entry data is set to 160 bits.

In this case, as for the address information (Hit Index), "00800 to O0FFF" in hexadecimal notation are assigned to 2048 pieces of entry data corresponding to the block number Blk #005 (logical block address "001"), respectively.

The first logical block address of the first segment 12 in which the size (DBW) of the entry data is set to 320 bits is set to "000".

There is shown a case in which "000" in hexadecimal notation as the logical block address is assigned to the segment 12 of a block number Blk #006 as the physical address, and the size (DBW) of the entry data is set to 320 bits.

In this case, as for the address information (Hit Index), "00000 to 003FF" in hexadecimal notation are assigned to 1024 pieces of entry data corresponding to the block number Blk #006 (logical block address "000"), respectively. There is shown a case in which "001" in hexadecimal notation as the logical block address is assigned to the segment 12 of a block number Blk #007 as the physical address, and the size (DBW) of the entry data is set to 320 bits.

In this case, as for the address information (Hit Index), "00400 to 007FF" in hexadecimal notation are assigned to 1024 pieces of entry data corresponding to the block number Blk #007 (logical block address "001"), respectively.

There is shown a case in which "002" in hexadecimal notation as the logical block address is assigned to the segment 12 of a block number Blk #008 as the physical address, and the size (DBW) of the entry data is set to 320 bits.

In this case, as for the address information (Hit Index), "00800 to 00BFF" in hexadecimal notation are assigned to 1024 pieces of entry data corresponding to the block number Blk #008 (logical block address "002"), respectively.

There is shown a case in which "003" in hexadecimal notation as the logical block address is assigned to the segment 12 of a block number Blk #009 as the physical address, and the size (DBW) of the entry data is set to 320 bits. In this case, as for the address information (Hit Index), "00000 to 00FFF" in hexadecimal notation are assigned to 1024 pieces of entry data corresponding to the block number Blk #009 (logical block address "003"), respectively.

There is shown a case in which "000" in hexadecimal notation as the logical block address is assigned to the segment 12 of a block number Blk #00A as the physical address, and the size (DBW) of the entry data is set to 640 bits.

In this case, as for the address information (Hit Index), "00000 to 001FF" in hexadecimal notation are assigned to 512 pieces of entry data corresponding to the block number Blk #00A (logical block address "000"), respectively.

There is shown a case in which "001" in hexadecimal notation as the logical block address is assigned to the segment 12 of a block number Blk #00B as the physical address, and the size (DBW) of the entry data is set to 640 bits.

In this case, as for the address information (Hit Index), "00200 to 003FF" in hexadecimal notation are assigned to 512 pieces of entry data corresponding to the block number Blk #00B (logical block address "001"), respectively. By this method, the address information (Hit Index) outputted from each of the retrieval units 81 to 84 is continuous in the address space based on the size of the entry data. More specifically, the address information that is reset so that the address information corresponding to the entry data becomes continuous for each size of the entry data is outputted.

Therefore, by the method according to the second embodiment, even if the physical block address is not continuous, the gap (empty area) in the address information is eliminated, and the address information is continuous; therefore, it is possible to reduce the load on the management side for managing the retrieval memory.

Further, this method is also advantageous in enhancing the retrieval function of the retrieval memory. For example, assume that 160-bit data is added as the size (DBW) of the entry data.

In this example, the segment 12 of a block number Blk #100 as the physical address is additionally set as the segment whose entry data size is 160 bits. The physical block address number Blk #100 of the additionally set segment is not continuous with the physical block address Blk #005 of the segment in which the size of the entry data has already been set to 160 bits. Therefore, "002" in hexadecimal notation as the logical block address is assigned to the segment 12 of the block number Blk #100 as the physical address, and the size (DBW) of the entry data is set to 160 bits.

As a result, as for the address information (Hit Index), "01000 to 017FF" in hexadecimal notation following the address information (Hit Index) obtained from the segment of the physical block address number Blk #005 are assigned to 2048 pieces of entry data corresponding to the block number Blk #100 (logical block address "002"), respectively.

Similarly, "003" in hexadecimal notation as the logical block address is assigned to the segment 12 of a block number Blk #101 as the physical address, and the size (DBW) of the entry data is set to 160 bits.

As a result, as for the address information (Hit Index), "01800 to 01FFF" in hexadecimal notation following the address information (Hit Index) obtained from the segment of the physical block address number Blk #100 are assigned to 2048 pieces of entry data corresponding to the block number Blk #101 (logical block address "003"), respectively.

If, unlike in the method of the second embodiment, management is performed using only the physical address without defining the logical address, it is necessary to shift the currently used physical address in order to maintain the continuity of the address information.

Accordingly, it is necessary to greatly change the address allocation, and the reconstruction of the retrieval memory becomes complicated.

On the other hand, by defining the logical address as in this method, it is easily possible to maintain the continuity of the address information as the logical address without shifting the physical address. Therefore, it is possible to easily perform the reconstruction of the retrieval memory as well.

In this example, there is also shown a case in which 640-bit data is added as the size (DBW) of the entry data.

In this example, "002" in hexadecimal notation as the logical block address is assigned to the segment 12 of a block number Blk #102 as the physical address, and the size (DBW) of the entry data is set to 640 bits.

In this case, as for the address information (Hit Index), "00400 to 005FF" in hexadecimal notation are assigned to 512 pieces of entry data corresponding to the block number Blk #102 (logical block address "002"), respectively.

Next, "003" in hexadecimal notation as the logical block address is assigned to the segment 12 of a block number Blk #103 as the physical address, and the size (DBW) of the entry data is set to 640 bits.

In this case, as for the address information (Hit Index), "00600 to 007FF" in hexadecimal notation are assigned to 512 pieces of entry data corresponding to the block number Blk #103 (logical block address "003"), respectively.

Next, "004" in hexadecimal notation as the logical block address is assigned to the segment 12 of a block number Blk #104 as the physical address, and the size (DBW) of the entry data is set to 640 bits.

In this case, as for the address information (Hit Index), "00800 to 009FF" in hexadecimal notation are assigned to 512 pieces of entry data corresponding to the block number Blk #104 (logical block address "004"), respectively.

Further, in this example, there is also shown a case in which 320-bit data is added as the size (DBW) of the entry data.

In this example, "004" in hexadecimal notation as the logical block address is assigned to the segment 12 of a block number Blk #105 as the physical address, and the size (DBW) of the entry data is set to 320 bits.

In this case, as for the address information (Hit Index), "01000 to 013FF" in hexadecimal notation are assigned to 1024 pieces of entry data corresponding to the block number Blk #105 (logical block address "004"), respectively. In this case as well, since it is easily possible to maintain the continuity of the address information as the logical address, it is possible to easily perform the reconstruction of the retrieval memory as well.

Further, a system for managing the retrieval memory might execute a maintenance operation such as deletion of entry data that is not accessed for a certain period.

In this case, a block defined at initial setting might become unnecessary by the maintenance operation, so that a memory space defined to be continuous at first might change to address information in a toothless state.

In such a state, in the related-art method, it is necessary to reconstruct the allocation of the address information for all blocks included in the retrieval memory in order to maintain the continuity of the address information. However, in this method, it is possible to delete the logical block address of the block that needs to be deleted. For example, in the case where a part of the block in which the size (DBW) of the entry data is set to 80 bits is deleted, it is possible to reconstruct the address information of a block group in which the size (DBW) of the entry data is set to 80 bits, and it is possible to maintain the address information about the size of the other entry data as it is; therefore, it is possible to easily perform the maintenance operation as well.

Thus, since it is possible to achieve the allocation of the address information having high degree of flexibility, a time required for the reconstruction of the retrieval memory is greatly improved, which makes it possible not only to enhance processing performance but also to reduce power consumption by eliminating unnecessary data exchange.

Third Embodiment

Figure 16:
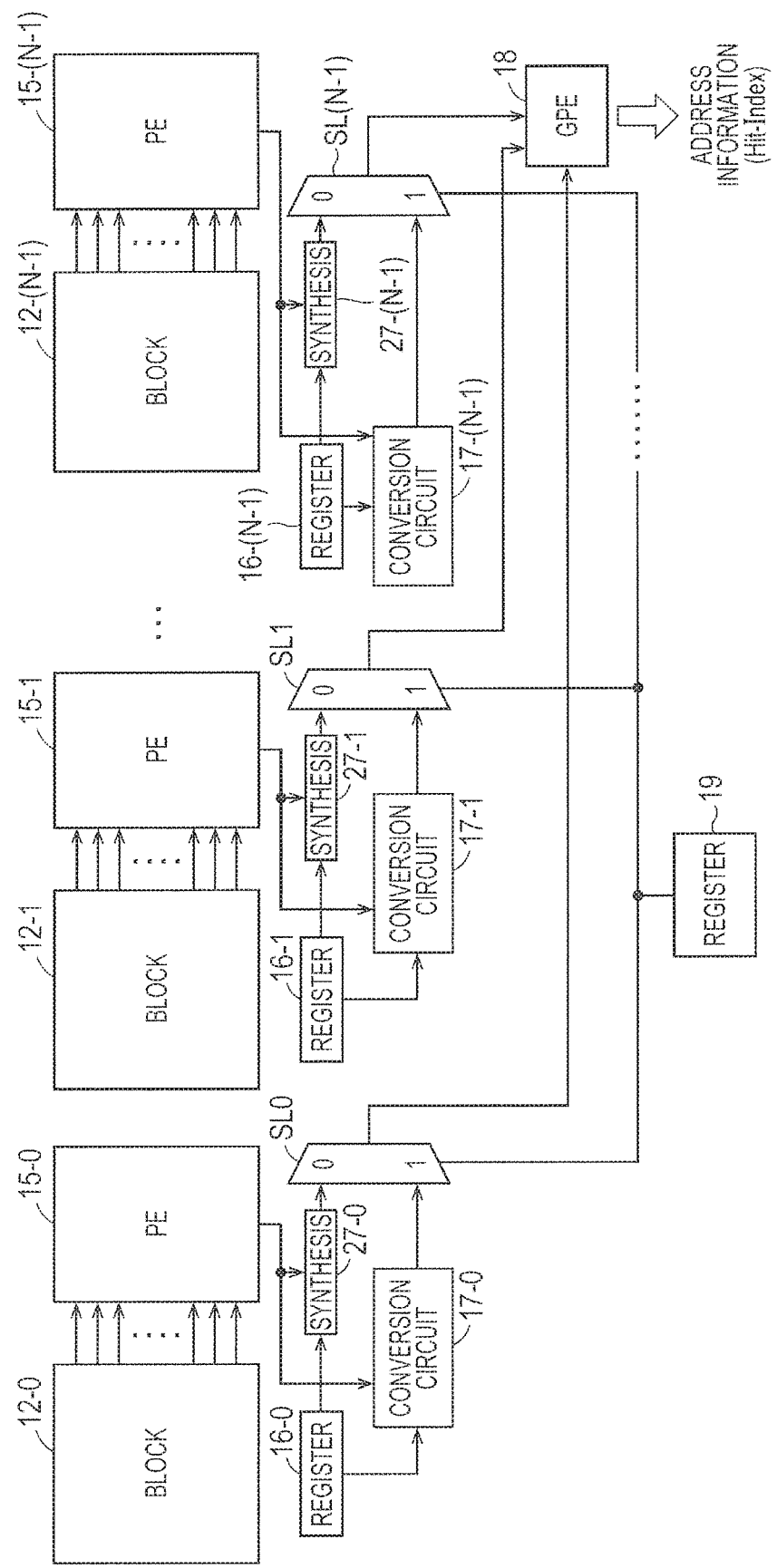
FIG. 16 is a diagram for explaining the configuration of multiple segments (sub-blocks) 12 included in each of the retrieval units 81 to 84 according to a third embodiment.

FIG. 16 is a diagram for explaining the configuration of multiple segments (sub-blocks) 12 included in each of the retrieval units 81 to 84 according to a third embodiment.

The configuration of FIG. 16 differs from that of FIG. 5 in that there are further provided multiple synthesis circuits 27-0 to 27-(N−1), multiple selectors SL0 to SL(N−1), and a register 19. The selectors SL0 to SL(N−1) are also generically called a selector SL.

The other configuration is the same as described with FIG. 5 according to the first embodiment; therefore, the detailed description will not be repeated.

The synthesis circuit 27-0 to 27-(N−1) outputs address information obtained by synthesizing the address data outputted from each priority encoder 15-0 to 15-(N−1) and the block address stored in each register 16-0 to 16-(N−1).

The selector SL0 to SL(N−1) switches output in accordance with data stored in the register 19. For example, if data "0" is stored in the register 19, the address information not subjected to the bit shift outputted from the synthesis circuit 27-0 to 27-(N−1) is outputted to the global priority encoder 18.

On the other hand, if data "1" is stored in the register 19, the address information subjected to the bit shift outputted from the conversion circuit 17 is outputted to the global priority encoder 18.

Therefore, in the case of using the address information not subjected to the bit shift as it is instead of the address information subjected to the bit shift, "0" is stored in the register 19. On the other hand, in the case of using the logical address, "1" is stored in the register 19.

With this configuration, it is possible to switch between the use of the physical address and the use of the reset logical address, which further improves versatility.

Figure 17:
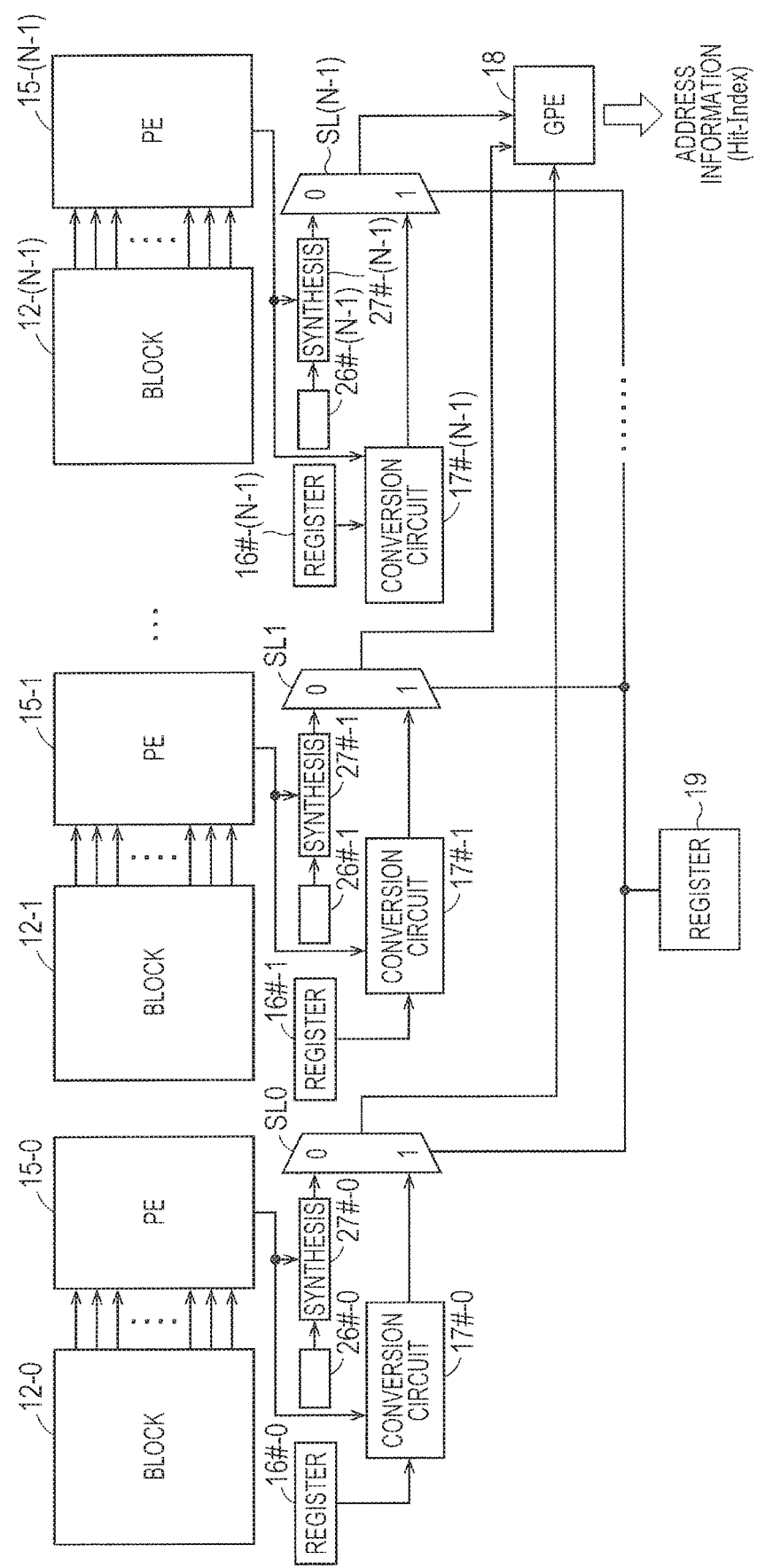
FIG. 17 is a diagram for explaining the configuration of multiple segments (sub-blocks) 12 included in each of the retrieval units 81 to 84 according to a modification of the third embodiment.

FIG. 17 is a diagram for explaining the configuration of multiple segments (sub-blocks) 12 included in each of the retrieval units 81 to 84 according to a modification of the third embodiment.

The configuration of FIG. 17 differs from that of FIG. 13 in that there are further provided multiple synthesis circuits 27#-0 to 27#-(N−1), multiple registers 26#-0 to 26#-(N−1), multiple selectors SL0 to SL(N−1), and a register 19.

The other configuration is the same as described with FIG. 13 according to the second embodiment; therefore, the detailed description will not be repeated.

Each register 26#-0 to 26#-(N−1) stores the physical block address.

The synthesis circuit 27#-0 to 27#-(N−1) outputs address information obtained by synthesizing the address data outputted from each priority encoder 15-0 to 15-(N−1) and the block address stored in each register 26#-0 to 26#-(N−1), respectively.

The selector SL0 to SL(N−1) switches output in accordance with data stored in the register 19. For example, if data "0" is stored in the register 19, the address information obtained by synthesizing the physical block address outputted from the synthesis circuit 27#-0 to 27#-(N−1) and the local address is outputted to the global priority encoder 18.

On the other hand, if data "1" is stored in the register 19, the data outputted from the conversion circuit 17#-0 to 17#-(N−1) is outputted to the global priority encoder 18.

Therefore, in the case of using the address information obtained by synthesizing the physical block address and the local address as it is instead of the logical address, "0" is stored in the register 19. On the other hand, in the case of using the logical address, "1" is stored in the register 19.

With this configuration, it is possible to switch between the use of the physical address and the use of the logical address, which further improves versatility.

The unit for supplying the physical block address to the synthesis circuit is not limited to the register, but may be any unit that can supply a unique fixed value indicating the physical block address.

Fourth Embodiment

Figure 18A:
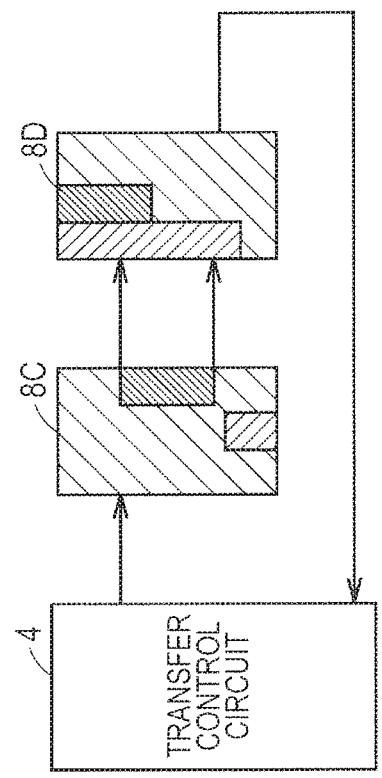
FIGS. 18A and 18B are diagrams for explaining a retrieval system according to a fourth embodiment.
Figure 18B:
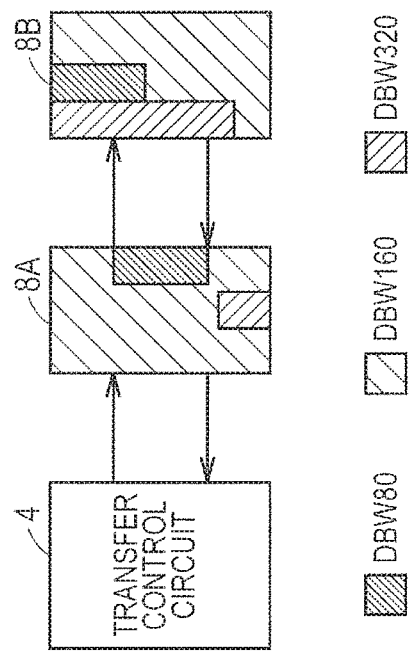

FIGS. 18A and 18B are diagrams for explaining a retrieval system according to a fourth embodiment.

Referring to FIGS. 18A and 18B, in the fourth embodiment, the retrieval system incorporating multiple retrieval memories will be described. More specifically, there are provided multiple chips where retrieval memories are mounted.

Further, in this example, the retrieval system capable of performing retrieval on the independent multiple chips as one retrieval memory will be described. In this example, the cascade connection of the multiple chips will be described.

Referring to FIG. 18A, a retrieval memory 8A and a retrieval memory 8B are cascaded to each other.

Search data is inputted from the transfer control circuit 4 to the retrieval memory 8A. The retrieval memory 8A performs a search operation according to the search data, and also transfers the search data to the retrieval memory 8B.

The retrieval memory 8B performs a search operation according to the search data transferred from the retrieval memory 8A.

The retrieval memory 8B outputs address information (Hit Index) as a search result to the retrieval memory 8A.

The retrieval memory 8A outputs address information (Hit Index) as a final search result to the transfer control circuit 4, based on a search result according to the search operation and the search result inputted from the retrieval memory 8B.

Referring to FIG. 18B, a retrieval memory 8C and a retrieval memory 8D are cascaded to each other in a different manner.

Search data is inputted from the transfer control circuit 4 to the retrieval memory 8C. The retrieval memory 8C performs a search operation according to the search data, and also transfers the search data to the retrieval memory 8D.

Further, the retrieval memory 8C outputs address information (Hit Index) as a search result to the retrieval memory 8B.

The retrieval memory 8D performs a search operation according to the search data transferred from the retrieval memory 8C.

The retrieval memory 8D outputs address information (Hit Index) as a final search result to the transfer control circuit 4, based on a search result according to the search operation and the search result inputted from the retrieval memory 8C.

Figure 19:
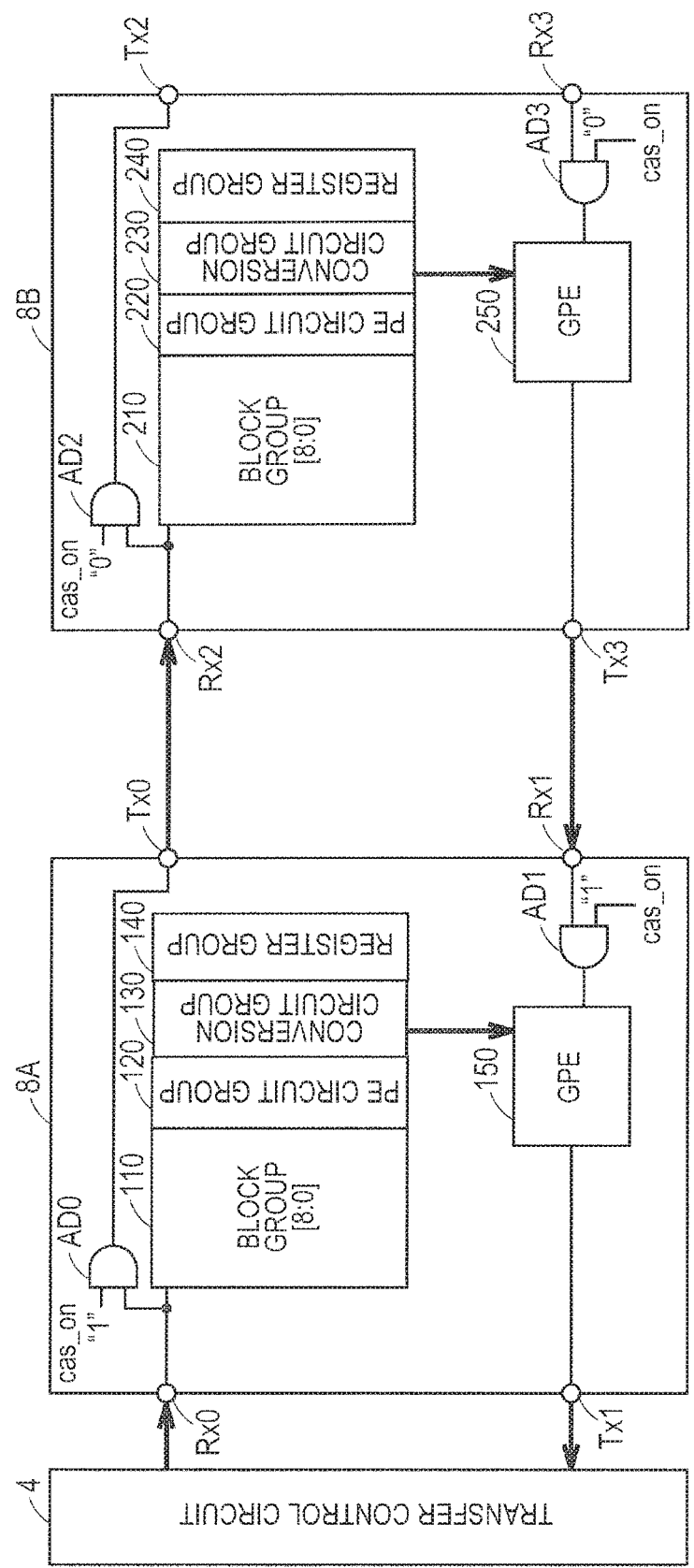
FIG. 19 is a diagram for explaining the configuration of retrieval memories 8A, 8B according to the fourth embodiment.

FIG. 19 is a diagram for explaining the configuration of the retrieval memories 8A, 8B according to the fourth embodiment. Referring to FIG. 19, the retrieval memory 8A includes AND circuits AD0, AD1, a block group 110, a PE group 120, a conversion circuit group 130, a register group 140, and a global priority encoder (GPE) 150.

The retrieval memory 8B includes AND circuits AD2, AD3, a block group 210, a PE group 220, a conversion circuit group 230, a register group 240, and a global priority encoder (GPE) 250.

Based on the input of a cascade connection signal cas_on and search data inputted to an input terminal Rx0, the AND circuit AD0 sets whether or not to transfer the search data to the subsequent stage.

If the cascade connection signal cas_on is "1", the search data is transferred to the subsequent circuit. On the other hand, if the cascade connection signal cas_on is "0", the search data is not transferred to the subsequent circuit.

In this example, the cascade connection signal cas_on is "1"; therefore, the search data is transferred to the subsequent retrieval memory 8B. More specifically, the search data is outputted from an output terminal Tx0 of the retrieval memory 8A to an input terminal Rx2 of the retrieval memory 8B.

Based on the cascade connection signal cas_on and the input of a search result inputted to an input terminal Rx1, the AND circuit AD1 sets whether or not to output the search result to the global priority encoder (GPE) 150.

If the cascade connection signal cas_on is "1", the search result is inputted to the global priority encoder (GPE) 150. On the other hand, if the cascade connection signal cas_on is "0", the search result is not inputted to the global priority encoder (GPE) 150.

In this example, the cascade connection signal cas_on is "1"; therefore, the search result from the retrieval memory 8B is received and inputted to the global priority encoder (GPE) 150. More specifically, the search result outputted from an output terminal Tx3 of the retrieval memory 8B to the input terminal Rx1 of the retrieval memory 8A is received.

The block group 110 includes multiple segments. Block numbers are defined by physical addresses [8:0]. In this example, the addresses are assigned to block numbers Blk # "0 to 511" in decimal notation, respectively.

The PE group 120 includes multiple priority encoders 15 provided corresponding to the multiple segments, respectively.

The conversion circuit group 130 includes multiple conversion circuits 17# provided corresponding to the multiple segments, respectively.

The register group 140 includes multiple registers 16# provided corresponding to the multiple segments, respectively.

The global priority encoder (GPE) 150 receives the output of the multiple conversion circuits 17#, and finally outputs the address information of high priority. At this time, if the search result from the retrieval memory 8B is inputted, the global priority encoder (GPE) 150 finally outputs the address information in consideration of the search result of the retrieval memory 8B as well.

Based on the input of a cascade connection signal cas_on and the search data inputted to the input terminal Rx2, the AND circuit AD2 sets whether or not to transfer the search data to the subsequent stage.

If the cascade connection signal cas_on is "1", the search data is transferred to the subsequent circuit. On the other hand, if the cascade connection signal cas_on is "0", the search data is not transferred to the subsequent circuit.

In this example, the cascade connection signal cas_on is "0"; therefore, the search data is not transferred to the subsequent circuit.

Based on the cascade connection signal cas_on and the input of a search result inputted to an input terminal Rx3, the AND circuit AD3 sets whether or not to output the search result to the global priority encoder (GPE) 250.

If the cascade connection signal cas_on is "1", the search result is inputted to the global priority encoder (GPE) 250. On the other hand, if the cascade connection signal cas_on is "0", the search result is not inputted to the global priority encoder (GPE) 250.

In this example, the cascade connection signal cas_on is "0"; therefore, the search result is not inputted to the global priority encoder (GPE) 250.

The block group 210 includes multiple segments 12. Block numbers are defined by physical addresses [8:0]. In this example, the addresses are assigned to block numbers Blk # "0 to 511" in decimal notation, respectively.

The PE group 220 includes multiple priority encoders 15 provided corresponding to the multiple segments 12, respectively.

The conversion circuit group 230 includes multiple conversion circuits 17# provided corresponding to the multiple segments 12, respectively.

The register group 240 includes multiple registers 16# provided corresponding to the multiple segments 12, respectively.

The global priority encoder (GPE) 250 receives the output of the multiple conversion circuits 17#, and finally outputs the address information of high priority. At this time, if the other cascaded search result is inputted, the global priority encoder (GPE) 250 finally outputs the address information in consideration of the search result of the retrieval memory 8B as well.

Referring again to FIG. 18, in the fourth embodiment, respective retrieval units for 80 bits, 160 bits, and 320 bits as the size (DBW) of the entry data are formed, using the multiple segments 12 included in the retrieval memories 8A, 8B, as described with FIG. 13.

Further, as described in the second embodiment, the block address set as the physical address is converted into the logical block address for each entry data size, and the addresses are managed.

More specifically, the logical block address and the size information of the entry data are stored in each register 16#. In this example, the total number of segments included in the retrieval memories 8A, 8B is 1024.

Therefore, logical block addresses are assigned to [9:0] in decimal notation respectively, for each size of the entry data as described with FIG. 15.

Further, in accordance with the method described in the second embodiment, address information is assigned to a number of pieces of entry data corresponding to the logical block addresses, respectively.

By this method, the address information (Hit Index) outputted from each retrieval unit is continuous in the address space based on the size of the entry data. The address information that is reset so that the address information corresponding to the entry data becomes continuous for each size of the entry data is outputted.

Thereby, it is possible to treat the multiple segments 12 included in the retrieval memories 8A, 8B as one retrieval memory.

Therefore, even if the entry data of different sizes is included among the multiple chips, the address information is continuous; therefore, it is possible to reduce the load on the management side (system side) for managing the retrieval memories.

Figure 20:
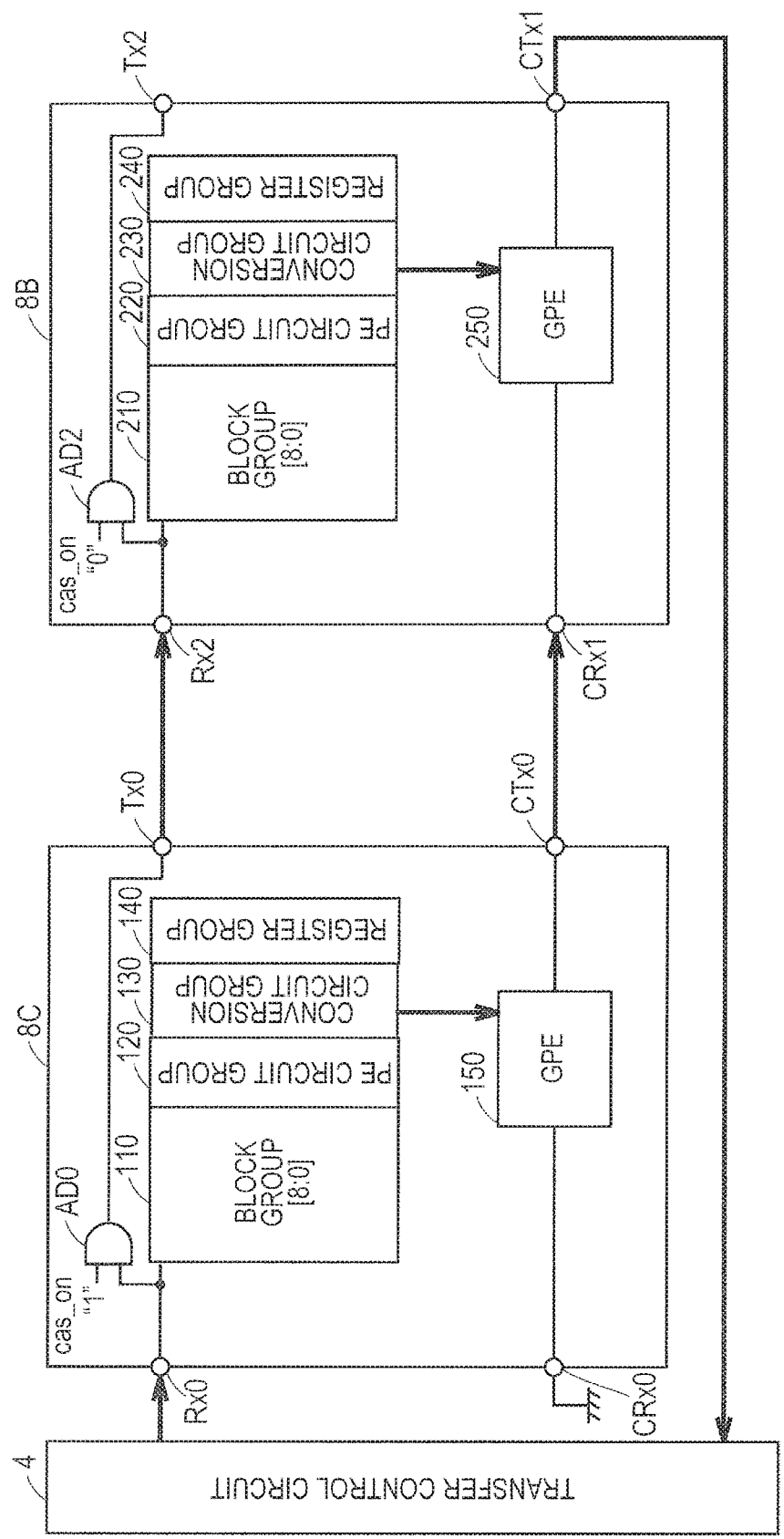
FIG. 20 is a diagram for explaining the configuration of retrieval memories 8C, 8D according to the fourth embodiment.

FIG. 20 is a diagram for explaining the configuration of the retrieval memories 8C, 8D according to the fourth embodiment. Referring to FIG. 20, the retrieval memory 8C differs from the retrieval memory 8A in that the AND circuit AD1 is not provided. Further, the retrieval memory 8D differs from the retrieval memory 8B in that the AND circuit AD3 is not provided. The other configuration is the same as the configuration of the retrieval memories 8A, 8B described with FIG. 19; therefore, the detailed description will not be repeated.

Based on the input of the cascade connection signal cas_on and the search data inputted to the input terminal Rx0, the AND circuit AD0 sets whether or not to transfer the search data to the subsequent stage.

If the cascade connection signal cas_on is "1", the search data is transferred to the subsequent circuit. On the other hand, if the cascade connection signal cas_on is "0", the search data is not transferred to the subsequent circuit.

In this example, the cascade connection signal cas_on is "1"; therefore, the search data is transferred to the subsequent retrieval memory 8D. More specifically, the search data is outputted from the output terminal Tx0 of the retrieval memory 8C to the input terminal Rx2 of the retrieval memory 8D.

The global priority encoder (GPE) 150 outputs the search result from an output terminal CTx0.

Based on the input of the cascade connection signal cas_on and the search data inputted to the input terminal Rx2, the AND circuit AD2 sets whether or not to transfer the search data to the subsequent stage.

If the cascade connection signal cas_on is "1", the search data is transferred to the subsequent circuit. On the other hand, if the cascade connection signal cas_on is "0", the search data is not transferred to the subsequent circuit.

In this example, the cascade connection signal cas_on is "0"; therefore, the search data is not transferred to the subsequent circuit.

The global priority encoder (GPE) 250 receives the output of the multiple conversion circuits 17#, and finally outputs the address information of high priority. At this time, if the other cascaded search result is inputted, the global priority encoder (GPE) 250 finally outputs the address information in consideration of the search result of the retrieval memory 8C as well.

In this example, the search result of the retrieval memory 8C is inputted from an input terminal CRx1. Therefore, the global priority encoder (GPE) 250 finally outputs the address information in consideration of the search result of the retrieval memory 8C as well from an output terminal CTx1.

The address information is outputted from the output terminal CTx1 to the transfer control circuit 4. Referring to FIG. 18, in the fourth embodiment, respective retrieval units for 80 bits, 160 bits, and 320 bits as the size (DBW) of the entry data are formed, using the multiple segments 12 included in each retrieval memory 8C, 8D, as described with FIG. 13.

Further, as described in the second embodiment, the block address set as the physical address is converted into the logical block address for each entry data size, and the addresses are managed.

More specifically, the logical block address and the size information of the entry data are stored in each register 16#. In this example, the total number of segments included in the retrieval memories 8C, 8D is 1024. Therefore, logical block addresses are assigned to [9:0] in decimal notation respectively, for each size of the entry data as described with FIG. 15.

Further, in accordance with the method described in the second embodiment, address information is assigned to a number of pieces of entry data corresponding to the logical block addresses, respectively.

By this method, the address information (Hit Index) outputted from each retrieval unit is continuous in the address space based on the size of the entry data. The address information that is reset so that the address information corresponding to the entry data becomes continuous for each size of the entry data is outputted.

Thereby, it is possible to treat the multiple segments 12 included in the retrieval memories 8C, 8D as one retrieval memory.

Therefore, even if the entry data of different sizes is included among the multiple chips, the address information is continuous; therefore, it is possible to reduce the load on the management side (system side) for managing the retrieval memories.

While the present disclosure has been described specifically based on the illustrated embodiments, the present disclosure is not limited thereto. It is needless to say that various changes and modifications can be made thereto without departing from the spirit and scope of the invention.

What is claimed is:

1. A retrieval memory which retrieves whether or not inputted retrieval data matches entry data stored in a memory cell array and outputs address information corresponding to matched entry data, the retrieval memory comprising:

a plurality of retrieval blocks; and an output control unit for outputting the address information, wherein the address information includes a block address for specifying at least one of the retrieval blocks and a logical address corresponding to entry data in the specified retrieval block, wherein the output control unit outputs address information that is reconfigured so that the address information corresponding to the entry data becomes continuous in an address space based on a size of the entry data, wherein the control unit comprises a plurality of block registers respectively provided to the retrieval blocks, the plurality of block registers storing information about a size of entry data and information about a retrieval block assigned for each size of the entry data among the retrieval blocks.

2. The retrieval memory according to claim 1, wherein the output control unit outputs address information that is reconfigured so that the address information corresponding to the entry data becomes continuous in an address space of (a maximum bit length N bits) in the case where the size of the entry data is increased by $2^N$ times (N: natural number).

3. The retrieval memory according to claim 2, wherein the output control unit executes shift arithmetic processing for shifting the block address by N bits.

4. The retrieval memory according to claim 1, wherein the output control unit comprises:
a plurality of local encoders which are provided corresponding to the retrieval blocks respectively, and output a local address corresponding to matched entry data; and a plurality of address conversion units which are provided corresponding to the retrieval blocks respectively, and perform conversion into a logical address corresponding to matched entry data in a specified retrieval block based on a corresponding local address and information stored in a corresponding block register.

5. The retrieval memory according to claim 4, wherein the output control unit further comprises a plurality of selectors which are provided corresponding to the retrieval blocks respectively, and selectively switch between a local address outputted from a corresponding local encoder and a logical address outputted from a corresponding address conversion unit.

6. The retrieval memory according to claim 1,
wherein a bit width of the address information is fixed regardless of the size of the entry data, wherein a bit width of the block address is fixed regardless of the size of the entry data, and wherein a bit width of the logical address is variable depending on the size of the entry data.

* * * * *